US012731624B2

(12) United States Patent
Wu et al.

(10) Patent No.: US 12,731,624 B2
(45) Date of Patent: Sep. 8, 2026

(54) CIRCUIT MODULE WITH IMPROVED TIMING CONTROL

(71) Applicant: M31 TECHNOLOGY CORPORATION, Hsinchu County (TW)

(72) Inventors: Po-Yu Wu, Hsinchu County (TW); Li-Wei Chu, Hsinchu County (TW); Nan-Chun Lien, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 157 days.

(21) Appl. No.: 18/829,321

(22) Filed: Sep. 10, 2024

(65) Prior Publication Data

US 2025/0087257 A1 Mar. 13, 2025

(30) Foreign Application Priority Data

Sep. 11, 2023 (TW) ................................ 112134487

(51) Int. Cl.
*G11C 7/22* (2006.01)
*G11C 7/06* (2006.01)
*G11C 8/08* (2006.01)

(52) U.S. Cl.
CPC ................. *G11C 7/22* (2013.01); *G11C 7/06* (2013.01); *G11C 8/08* (2013.01)

(58) Field of Classification Search
CPC .... G11C 7/22; G11C 7/06; G11C 8/08; G11C 7/08; G11C 5/063; G11C 7/1048; G11C 7/12
USPC ........................................................ 365/194
See application file for complete search history.

(56) References Cited

U.S. PATENT DOCUMENTS

| | | | |
|---|---|---|---|
| 6,118,746 A | 9/2000 | Verboom | |
| 8,447,547 B2 | 5/2013 | Jung et al. | |
| 8,792,288 B1 * | 7/2014 | Bartling | G11C 29/36 365/207 |

(Continued)

FOREIGN PATENT DOCUMENTS

| | | |
|---|---|---|
| JP | 2004005777 A | 1/2004 |
| JP | 2013069372 A | 4/2013 |
| WO | WO 2015147587 A1 | 10/2015 |

OTHER PUBLICATIONS

Office Action of Taiwan application No. 112134487 dated Jul. 22, 2024.

*Primary Examiner* — Amir Zarabian
(74) *Attorney, Agent, or Firm* — WPAT, PC

(57) ABSTRACT

A circuit module with improved timing control, may comprise a functional circuit, a control circuit, a main auxiliary circuit and an additional auxiliary circuit. The control circuit may control operation timing of the functional circuit according to response characteristics of a first node. When enabled, the main auxiliary circuit may provide main conduction path(s) between the first node and a base node. Respectively when enabled and disabled, the additional auxiliary circuit may provide and not provide additional conduction path(s) between the first node and the base node. When the control circuit controls the operation timing of the functional circuit, the main auxiliary circuit may be enabled, and the additional auxiliary circuit may be disabled or enabled according to whether a mode signal is of a first mode level or a second level.

20 Claims, 12 Drawing Sheets

(56) References Cited

U.S. PATENT DOCUMENTS

| | | | | |
|---|---|---|---|---|
| 9,076,557 | B2 | 7/2015 | Grant | |
| 11,621,038 | B2 | 4/2023 | Kang et al. | |
| 11,935,581 | B2 | 3/2024 | Chu et al. | |
| 2003/0076138 | A1 | 4/2003 | Hwang | |
| 2014/0119118 | A1* | 5/2014 | Lee | G11C 14/0063 365/185.08 |
| 2014/0153346 | A1* | 6/2014 | Roy | G11C 7/12 365/189.15 |
| 2022/0399052 | A1* | 12/2022 | Chu | G11C 11/4085 |
| 2024/0185912 | A1 | 6/2024 | Chu et al. | |

* cited by examiner

CIRCUIT MODULE WITH IMPROVED TIMING CONTROL

This application claims the benefit of Taiwan application Serial No. 112134487, filed Sep. 11, 2023, the subject matter of which is incorporated herein by reference.

FIELD OF THE INVENTION

The present invention relates to a circuit module with improved timing control; more particularly, to a circuit module which may, e.g., be a memory module with memory cells, and may further comprise a control circuit, a functional circuit, a main auxiliary circuit and an additional auxiliary circuit; wherein the control circuit may control operation timing of the functional circuit according to response characteristics of a first node (e.g., time for a voltage at the first node to change from a certain level to another level), the main auxiliary circuit may provide one or more main conduction paths between the first node and a base node when enabled, the additional auxiliary circuit may provide or not provide one or more additional conduction paths between the first node and the base node respectively when enabled or disabled; when the control circuit controls the operation timing of the functional circuit, the main auxiliary circuit may be enabled, the additional auxiliary circuit may be disabled or enabled according to whether a mode signal is of a first mode level or not; the main auxiliary circuit and/or the additional auxiliary circuit may comprise one or more modified memory cells.

BACKGROUND OF THE INVENTION

Various circuit modules, such as silicon intellectual properties or memory modules, are essential building blocks of an integrated circuit. A circuit module may include one or more functional circuits inside, and may generate one or more internal timing signals under triggering of a clock to control operation timing of the one or more functional circuits.

SUMMARY OF THE INVENTION

For both power and performance, a circuit module according to the invention may switch to operate in different modes, such as a high-performance mode of high clock rate and high voltage, as well as a low-power mode of low clock rate and low voltage; furthermore, under the different modes, the circuit module according to the invention may dynamically and adaptively adjust operation timing of the functional circuit(s).

An objectivity of the invention is providing a circuit module (e.g., 10 in FIG. 1*a* or FIG. 2) with improved timing control. The circuit module may comprise a functional circuit (e.g., 40 in FIG. 1*a* or FIG. 2), a control circuit (e.g., 20 in FIG. 1*a* or FIG. 2), a main auxiliary circuit (e.g., 210, 310 or 910 in FIG. 2, FIG. 3*a* or FIG. 9) and an additional auxiliary circuit (e.g., 220, 320, 420 or 820 in FIG. 2, FIG. 3*a*, FIG. 4*a* or FIG. 8*a*). The control circuit may be coupled between the functional circuit and a first node (e.g., n1 in FIG. 1*a* or FIG. 2), the main auxiliary circuit may be coupled to the first node, and the additional auxiliary circuit may be coupled to the first node and a mode signal (e.g., dvs_sa_relax in FIG. 1*a* or FIG. 2). The control circuit may control an operation timing of the functional circuit according to response characteristics of the first node. When the main auxiliary circuit is enabled, the main auxiliary circuit may provide one or more main conduction paths between the first node and a base node (e.g., no in FIG. 1*a* or FIG. 2); when the main auxiliary circuit is disabled, the main auxiliary circuit may not provide the one or more main conduction paths. When the additional auxiliary circuit is enabled, the additional auxiliary circuit may provide one or more additional conduction paths between the first node and the base node; when the additional auxiliary circuit is disabled, the additional auxiliary circuit may not provide the one or more additional conduction paths. When the control circuit controls the operation timing of the functional circuit according to the response characteristics of the first node, the main auxiliary circuit may be enabled, and the additional auxiliary circuit may be disabled or enabled according to whether the mode signal is of a first mode level (e.g., v1 in FIG. 1*b*) or a second mode level (e.g., v0 in FIG. 1*b*).

In an embodiment (e.g., FIG. 1*a* or FIG. 2), the circuit module may further comprise one or more word lines (e.g., WL[1] to WL[I]), one or more bit lines (e.g., BL[1] to BL[I'] and BL'[1] to BL'[I']), one or more memory cells (e.g., c[1,1] to c[I,I']), a tracking word line (e.g., TWL), a tracking bit line (e.g., TBL), and one or more tracking memory cells (e.g., tc[1] to tc[I]). Each memory cell (e.g., c[i,i']) may be coupled to one (e.g., WL[i]) of the one or more word lines and one (e.g., BL[i']) of the one or more bit lines. Each tracking memory cell (e.g., tc[i]) may be coupled to the tracking bit line and one (e.g., WL[i]) of the one or more word lines. The first node may be further coupled to the tracking bit line. The functional circuit may comprise one or more sensing amplifiers (e.g., sa[1] to sa[J]), and each of the one or more sensing amplifiers may sense a voltage of one of the one or more bit lines according to the operation timing.

In an embodiment (e.g., FIG. 3*c*), the control circuit may control the operation timing of the functional circuit according to the response characteristics of the first node when the tracking word line is driven (e.g., after tc0).

In an embodiment (e.g., FIG. 3*a* and FIG. 3*b*), the main auxiliary circuit (e.g., 310 in FIG. 3*a*) may comprise one or more first modified memory cells (e.g., h[1,1] to h[K, K'] in FIG. 3*a*). Each first modified memory cell (e.g., h[k,k'] in FIG. 3*b*) may comprise a pass-gate transistor (e.g., gd31[*k*, *k*']) and a storage transistor (e.g., d31[*k*,*k*']). The storage transistor may comprise a storage controlled terminal and two storage channel terminals (e.g., a gate terminal, a drain terminal and a source terminal), and the pass-gate transistor may comprise a pass-gate controlled terminal and two pass-gate channel terminals (e.g., a gate terminal, a drain terminal and a source terminal). The two pass-gate channel terminals and the two storage channel terminals may be serially coupled between the first node and the base node; one of the pass-gate controlled terminal and the storage controlled terminal may be coupled to the tracking word line, and the other one of the pass-gate controlled terminal and the storage controlled terminal may be coupled to a supply voltage (e.g., Vcc).

In an embodiment (e.g., FIG. 3*a*), the additional auxiliary circuit (e.g., 320 in FIG. 3*a*) may comprise a front-stage transistor (e.g., L31) and a back-stage transistor (e.g., L32). The front-stage transistor may comprise a front-stage controlled terminal and two front-stage channel terminals (e.g., a gate terminal, a drain terminal and a source terminal), and the back-stage transistor may comprise a back-stage controlled terminal and two back-stage channel terminals (e.g., a gate terminal, a drain terminal and a source terminal). The two front-stage channel terminals and the two back-stage channel terminals may be serially coupled between the first node and the base node; one of the front-stage controlled terminal and the back-stage controlled terminal may be coupled to the mode signal, and the other one of the front-stage controlled terminal and the back-stage controlled terminal may be coupled to the tracking word line.

In an embodiment (e.g., FIG. 3*a*), the additional auxiliary circuit may further comprise an inverter (e.g., L33 in FIG. 3*a*), and the one of the front-stage controlled terminal and the back-stage controlled terminal may be coupled to the mode signal via the inverter.

In an embodiment (e.g., FIG. 4*a* and FIG. 4*b*), the additional auxiliary circuit (e.g., 420 in FIG. 4*a*) may comprise one or more second modified memory cells (e.g., u[1,1] to u[Q,Q'] in FIG. 4*a*). Each second modified memory cell (e.g., u[q,q'] in FIG. 4*b*) may comprise a pass-gate transistor (e.g., gd41[*q,q*']) and a storage transistor (e.g., d41[*q,q*']). The storage transistor may comprise a storage controlled terminal and two storage channel terminals (e.g., a gate terminal, a drain terminal and a source terminal), and the pass-gate transistor may comprise a pass-gate controlled terminal and two pass-gate channel terminals (e.g., a gate terminal, a drain terminal and a source terminal). The two pass-gate channel terminals and the two storage channel terminals may be serially coupled between the first node and the base node; one of the pass-gate controlled terminal and the storage controlled terminal may be coupled to the mode signal, and the other one of the pass-gate controlled terminal and the storage controlled terminal may be coupled to the tracking word line.

In an embodiment (e.g., FIG. 4*a* and FIG. 4*b*), the additional auxiliary circuit may further comprise an inverter (e.g., L41), and the one of the pass-gate controlled terminal and the storage controlled terminal may be coupled to the mode signal via the inverter.

In an embodiment (e.g., FIG. 5, FIG. 6*a* or FIG. 7*a*), the circuit module may further comprise a tuning load (e.g., 550 or 650 in FIG. 5 or FIG. 6*a*) and a tuning switch circuit (e.g., 560, 660 or 760 in FIG. 5, FIG. 6*a* or FIG. 7*a*). The tuning switch circuit may be coupled between the tuning load and the first node, and may control whether to electrically connect (conduct) the tuning load to the first node according to a tuning control signal (e.g., sc1).

In an embodiment (e.g., FIG. 6*a* or FIG. 7*a*), the tuning load may comprise an additional bit line (e.g., ABL) and one or more additional memory cells (e.g., ac[1] to ac[I]). Each additional memory cell (e.g., ac[i]) may be coupled to the additional bit line and one (e.g., WL[i]) of the one or more word lines, and the tuning switch circuit may be coupled to the tuning load at the additional bit line.

In an embodiment (e.g., FIG. 6*a* or FIG. 7*a*), the tuning switch circuit (e.g., 660 or 760) may comprise a main switch (e.g., ss1). The main switch may be coupled between the first node and the tuning load, and may comprise a main switch control terminal (e.g., n8 or n10 in FIG. 6*a* or FIG. 7*a*); when a logic value of the main switch control terminal is a first logic value (e.g., logic 1), the main switch may electrically connect (conduct) the tuning load to the first node; and when the logic value of the main switch control terminal is a second logic value (e.g., logic 0), the main switch may not electrically connect the tuning load to the first node.

In an embodiment (e.g., FIG. 6*a* or FIG. 7*a*), the tuning switch circuit (e.g., 660 or 760) may further comprise an additional switch (e.g., ss2) coupled among the main switch control terminal, the tuning load and a supply voltage (e.g., Vcc). When the logic value of the main switch control terminal is the second logic value, the additional switch may electrically connect (conduct) the tuning load to the supply voltage; when the logic value of the main switch control terminal is the first logic value, the additional switch may not electrically connect the tuning load to the supply voltage.

In an embodiment (e.g., FIG. 7*a*), the tuning switch circuit (e.g., 760) may further comprise a tuning logic circuit (e.g., 770). The tuning logic circuit may comprise a first logic input terminal (e.g., n1), a second logic input terminal (e.g., n8) and a logic output terminal (e.g., n10) respectively coupled to the first node, the tuning control signal and the main switch control terminal.

In an embodiment (e.g., FIG. 7*a* and FIG. 7*b*), the tuning logic circuit may determine whether a logic value of the first logic input terminal is the first logic value or the second logic value according to whether a voltage at the first logic input terminal is higher than a tuning logic trip point level (e.g., vp_L72 in FIG. 7*b*), and may determine a logic value of the logic output terminal according to the logic value of the first logic input terminal and a logic value of the second logic input terminal. The control circuit may determine whether a logic value of the first node is the first logic value or the second logic value according to whether a voltage at the first node is higher than a control logic trip point level (e.g., vp_20 in FIG. 7*b*). The tuning logic trip point level and the control logic trip point value may be different.

In an embodiment (e.g., FIG. 7*b*), the tuning logic trip point level is higher than the control logic trip point level.

In an embodiment (e.g., FIG. 7*b*), the tuning logic circuit may further comprise a two-input NAND gate (e.g., L72) and an inverter (e.g., L73).

In an embodiment (e.g., FIG. 7*b*), the response characteristics of the first node may relate to an interval (e.g., Ti3) during which a voltage at the first node changes from an initial level (e.g., v31) to a reference level (e.g., vp_20). There may exist a middle level (e.g., vp_L72) between the initial level and the reference level. When the tuning switch circuit controls whether to electrically connect the tuning load to the first node according to the tuning control signal, the tuning switch circuit may control whether to electrically connect the tuning load to the first node according to whether the tuning control signal is the first logic value (e.g., logic 1) when the voltage at the first node changes from the initial level to the middle level (e.g., during Ti1). When the voltage at the first node changes from the middle level to the reference level (e.g., during Ti2), the tuning switch circuit may not electrically connect the tuning load to the first node regardless of whether the tuning control signal is the first logic value.

In an embodiment (e.g., FIG. 7*b*), the response characteristics of the first node may relate to an interval (e.g., Ti3) during which the voltage at the first node changes from the initial level (e.g., v31) to the reference level (e.g., vp_20). When the tuning switch circuit controls whether to electrically connect the tuning load to the first node according to the tuning control signal, the tuning switch circuit may control whether to electrically connect the tuning load to the first node according to whether the tuning control signal is the first logic value during a first portion of the interval (e.g., during Ti1). During a second portion of the interval (e.g., during Ti2), the tuning switch circuit may not electrically connect the tuning load to the first node regardless of whether the tuning control signal is the first logic value.

In an embodiment (e.g., FIG. 1*a* and FIG. 1*b*), the circuit module may be supplied by a supply voltage (e.g., Vcc in FIG. 1*a*). When a value of the supply voltage is a first voltage value (e.g., vcc1 in FIG. 1*b*), the mode signal may be of the first mode level; when the value of the supply voltage is a second voltage value (e.g., vcc0 in FIG. 1*b*), the mode signal may be of the second mode level, wherein the first voltage value and the second voltage value may be different; for example, the first voltage value may be lower than the second voltage value.

In an embodiment (e.g., FIG. 1*a* and FIG. 1*b*), the circuit module may be triggered by a clock (e.g., CK1 in FIG. 1*a*). When a period of the clock is a first period value (e.g., T1 in FIG. 1*b*), the mode signal may be of the first mode level; when the period of the clock is a second period value (e.g., TO in FIG. 1*b*), the mode signal may be of the second mode level, wherein the first period value and the second period value may be different; for example, the first period value may be longer than the second period value.

In an embodiment (e.g., FIG. 3*c*), when the mode signal remains to be of the first mode level, a time (e.g., a duration) for the voltage at the first node to change from the initial level (e.g., v31) to the reference level (e.g., v30) may be a first time value (e.g., T11); when the mode signal remains to be of the second mode level, a time for the voltage at the first node to change from the initial level (e.g., v31) to the reference level (e.g., v30) may be a second time value (e.g., T00). The operation timing may relate to a timing parameter, a margin of the timing parameter may cover a second margin value and a first margin value, the second margin value may relate (e.g., positively relate) to the second time value, and the first margin value may relate (e.g., positively relate) to the first time value.

An objectivity of the invention is providing a method for a circuit module (e.g., 10 in FIG. 1*a* or FIG. 2) to implement improved timing control. The circuit module may comprise a functional circuit (e.g., 40 in FIG. 1*a* or FIG. 2), a control circuit (e.g., 20 in FIG. 1*a* or FIG. 2), a main auxiliary circuit (e.g., 210, 310 or 910 in FIG. 2, FIG. 3*a* or FIG. 9) and an additional auxiliary circuit (e.g., 220, 320, 420 or 820 in FIG. 2, FIG. 3*a*, FIG. 4*a* or FIG. 8*a*). The control circuit may be coupled between the functional circuit and a first node (e.g., n1 in FIG. 1*a* or FIG. 2), the main auxiliary circuit may be coupled to the first node, and the additional auxiliary circuit may be coupled to the first node and a mode signal (e.g., dvs_sa_relax in FIG. 1*a* or FIG. 2). When the main auxiliary circuit is enabled, the main auxiliary circuit may provide one or more main conduction paths between the first node and a base node (e.g., n0 in FIG. 1*a* or FIG. 2); when the main auxiliary circuit is disabled, the main auxiliary circuit may not provide the one or more main conduction paths. When the additional auxiliary circuit is enabled, the additional auxiliary circuit may provide one or more additional conduction paths between the first node and the base node; when the additional auxiliary circuit is disabled, the additional auxiliary circuit may not provide the one or more additional conduction paths. The method may comprise: causing the control circuit to control an operation timing of the functional circuit according to response characteristics of the first node; when the control circuit controls the operation timing of the functional circuit according to the response characteristics of the first node, causing the main auxiliary circuit to be enabled, and causing the additional auxiliary circuit to be disabled or enabled according to whether the mode signal is of the first mode level (e.g., v1 in FIG. 1*b*).

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
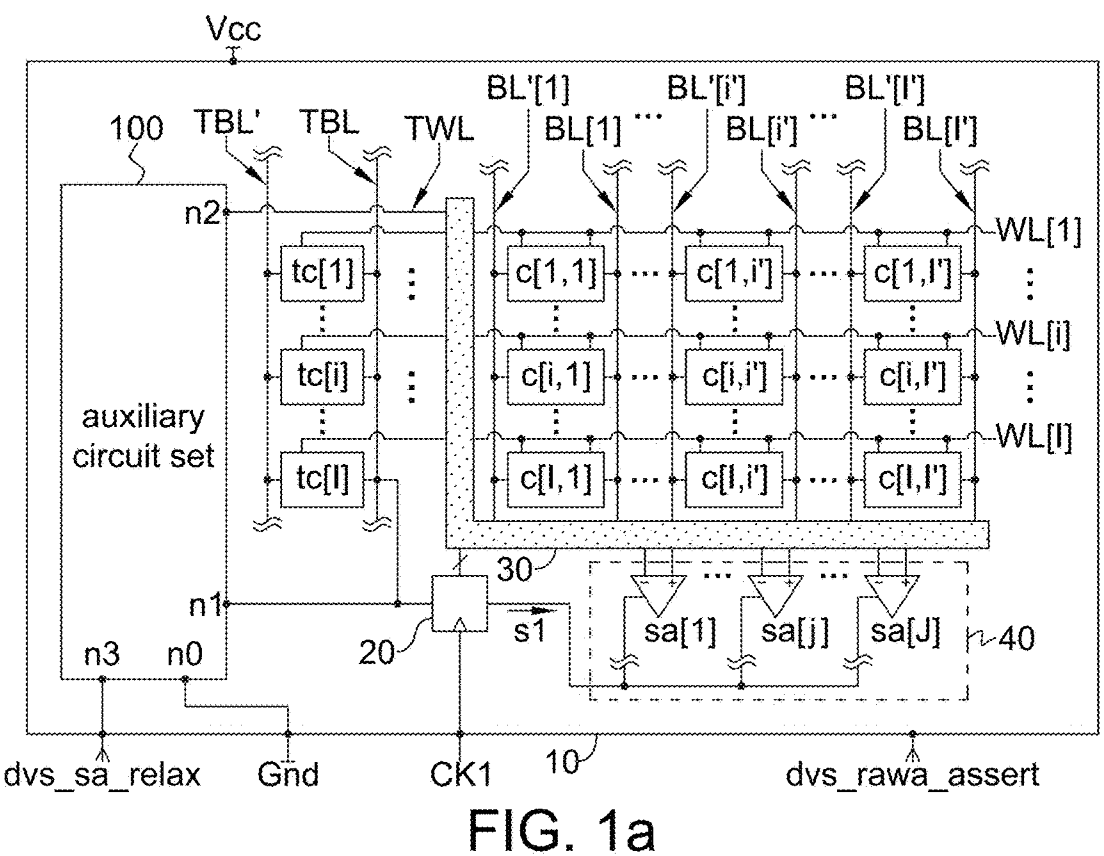
FIG. 1*a* depicts a circuit module according to an embodiment of the invention, wherein the circuit module may include one or more memory cells, one or more tracking memory cells and an auxiliary circuit set, may be supplied by a supply voltage, and may receive one or more mode signals and a clock.

FIG. 1*a* depicts a circuit module 10 according to an embodiment of the invention. For example, the circuit module may be a memory module, such as a static random access memory (SRAM) module embodied in a processor chip or die. The circuit module 10 may be triggered by a clock CK1, and may be biased between a supply voltage Vcc and a ground voltage Gnd to be supplied by the supply voltage Vcc. The circuit module 10 may operate in different modes, and may receive one or more mode signals relating to the operation modes, such as signals dvs_sa_relax and dvs_rawa_assert. Under different modes, a period value of the clock CK1 and/or a voltage value of the supply voltage Vcc may be different.

Figure 1B:
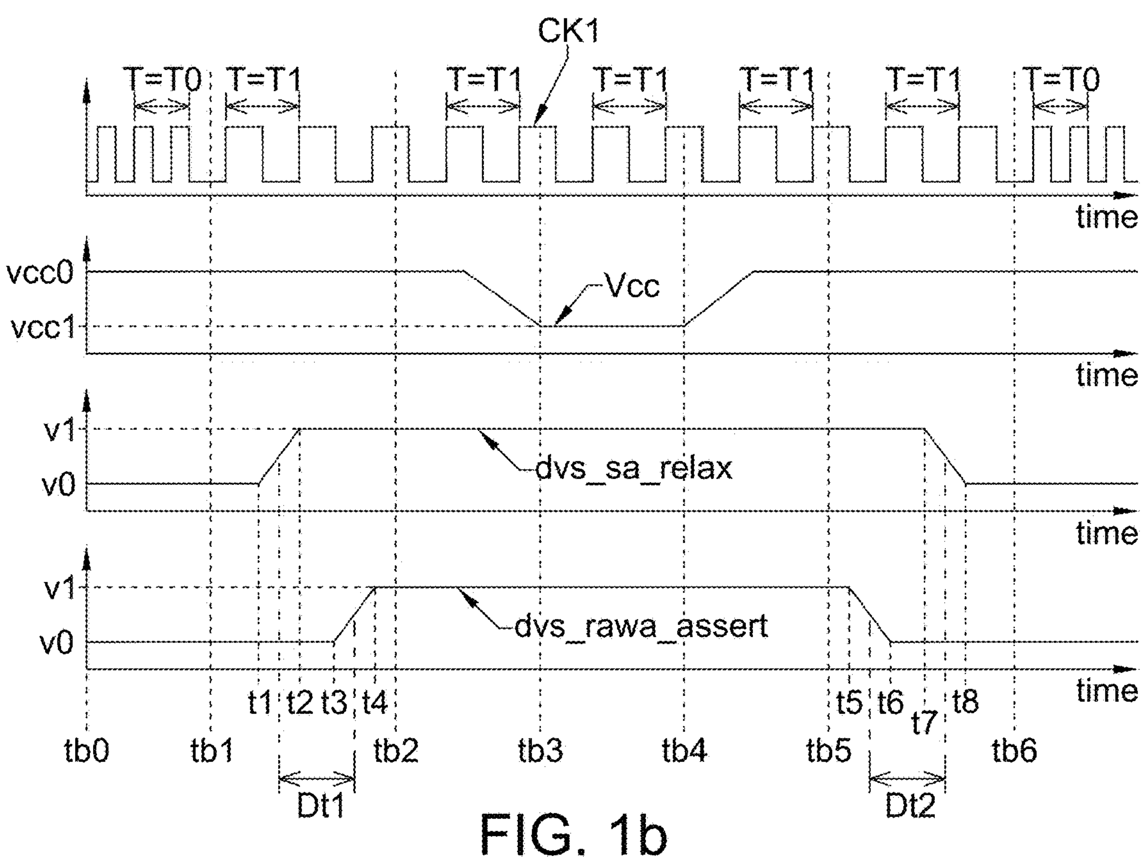
FIG. 1*b* depicts waveform and timing embodiments of the clock, the supply voltage and the mode signal(s) in FIG. 1*a;*

FIG. 1*b* depicts waveform and timing embodiments of the supply voltage Vcc, the clock CK1 and the signals dvs_sa_relax and dvs_rawa_assert. As shown in FIG. 1*b*, between time points tb0 and tb1, a period T of the clock CK1 may equal a period value TO, a value of the supply voltage Vcc may equal a voltage value vcc0, and the signals dvs_sa_relax and dvs_rawa_assert may be of a level v0.

Between the time point tb1 and a time point tb2, the period T of the clock CK1 may change to another period value T1, and the value of the supply voltage Vcc may remain to be the voltage value vcc0, wherein the period values TO and T1 may be different. For example, the period value T1 may be longer than the period value TO; that is, the clock CK1 may change from a higher frequency (1/T0) to a lower frequency (1/T1) after the time point tb1. Furthermore, between the time points tb1 and tb2, the signal dvs_sa_relax may change from the level v0 to another different level v1 during time points t1 to t2; after a delay time Dt1, the signal dvs_rawa_assert may change from the level v0 to the level v1 during time points t3 to t4. In an embodiment, the levels v0 and v1 may respectively correspond to logic 0 and logic 1.

Between the time point tb2 and a time point tb3, the period T of the clock CK1 may remain to be the period value T1, the value of the supply voltage Vcc may change from the voltage value vcc0 to another different voltage value vcc1; for example, the voltage value vcc1 may be lower than the voltage value vcc0. The signals dvs_sa_relax and dvs_rawa_assert may remain to be of the level v1.

Between the time point tb3 and a time point tb4, the period T of the clock CK1 may remain to be the period value T1, the value of the supply voltage Vcc may remain to be the voltage value vcc1, and the signals dvs_sa_relax and dvs_rawa_assert may remain at the level v1. Before the time point tb1, the circuit module 10 may originally operate under the period value T0 and the voltage value vcc0 (e.g., in a high-performance mode); after preparation of mode change during the time points tb1 to tb3, the circuit module 10 may change to operate under the period value T1 and the voltage value vcc1 (e.g., in a low-power mode) after the time point tb3.

Between the time point tb4 and a time point tb5, the period T of the clock CK1 may remain to be the period value T1, the value of the supply voltage Vcc may change back from the voltage value vcc1 to the voltage value vcc0, and the signals dvs_sa_relax and dvs_rawa_assert may remain at the level v1.

Between the time point tb5 and a time point tb6, the period T of the clock CK1 may remain to be the period value T1, the value of the supply voltage Vcc may remain to be the voltage value vcc0. Furthermore, between the time points tb5 and tb6, the signal dvs_rawa_assert may change from the level v1 to the level v0 during time points t5 to t6; after a delay time Dt2, the signal dvs_sa_relax may change from the level v1 to the level v0 during time points t7 to t8.

After the time point tb6, the period T of the clock CK1 may change back to the period value T0, the value of the supply voltage Vcc may remain to be the voltage value vcc0. Between the time points tb3 and tb4, the circuit module 10 may originally operate under the period value T1 and the voltage value vcc1; after preparation of mode change during the time points tb4 to tb6, the circuit module 10 may change to operate under the period value T0 and the voltage value vcc0. As depicted in FIG. 1*b*, level change of the signals dvs_sa_relax and dvs_rawa_assert and mode change of the circuit module 10 may be mutually related (associated).

Referring back to FIG. 1*a*; as shown in FIG. 1*a*, the circuit module 10 may comprise number I of word lines WL[1] to WL[I], number I' of sets of bit lines BL[1] to BL[I'] and BL'[1] to BL'[I'], number I*I' of memory cells c[1,1] to c[I, I'], a tracking word line TWL, a set of track bit lines TBL and TBL', number I of tracking memory cells tc[1] to tc[I], number J of sensing amplifiers sa[1] to sa[J], a control circuit 20 and a peripheral circuit 30. The sensing amplifiers sa[1] to sa[J] may form a functional circuit 40 inside. In FIG. 1*a*, each of the numbers I, I' and J may be a constant integer greater than or equal to one; the number J may be equal to, may be greater than or may be less than the number I, and the number I' may be greater than or equal to the number J. Each memory cell c[i,i'] (for indices i=1 to I and i'=1 to I') may be coupled to a corresponding word line WL[i] and a corresponding set of bit lines BL[i'] and BL'[i']. Each tracking memory cell tc[i] (for index i=1 to I) may be coupled to the word line WL[i] and the tracking bit lines TBL and TBL'. The word lines WL[1] to WL[I], the bit lines BL[1] to BL[I'] and BL'[1] to BL'[I'], the tracking word line TWL and the sensing amplifiers sa[1] to sa[J] may be further coupled to the peripheral circuit 30. The control circuit 20 may be coupled to the clock CK1, the peripheral circuit 30 and the functional circuit 40, and may be coupled to the tracking bit line TBL at a node n1.

To implement the invention, the circuit module 10 may further comprise an auxiliary circuit set 100. The auxiliary circuit set 100 may be coupled to the tracking bit line TBL at the node n1, and may be further coupled to the ground voltage Gnd, the tracking word line TWL and the signal dvs_sa_relax at another three nodes n0, n2 and n3, respectively. The circuit module 10 may further comprise other circuit(s), and/or, may further input and/or output other signal(s) (e.g., addresses to be accessed, data to be written in and/or data read out), but said other circuit(s) and/or said other signal(s) is (are) omitted for conciseness.

Figure 1C:
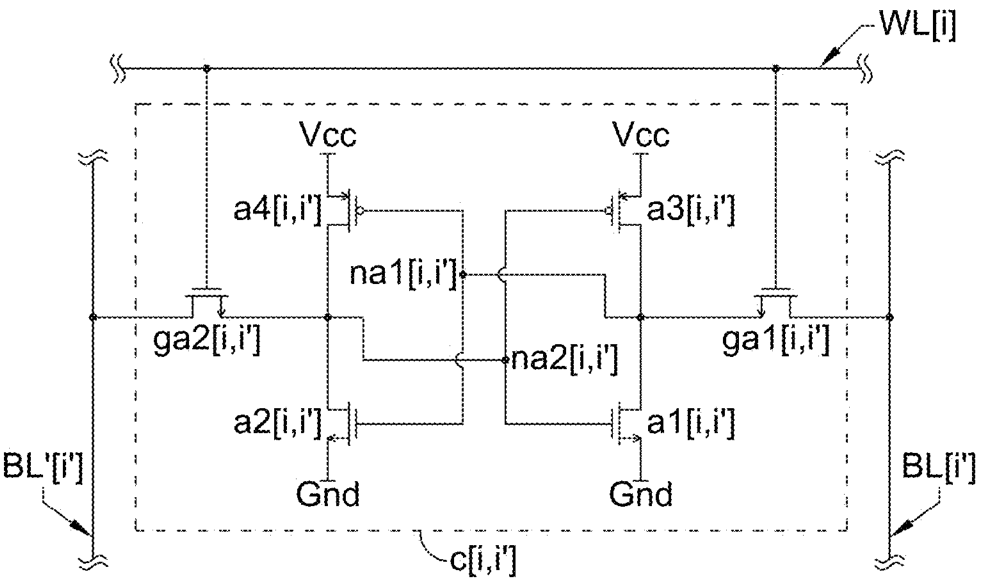
FIG. 1*c* depicts an embodiment of the memory cell in FIG. 1*a;*

In the circuit module 10 shown in FIG. 1*a*, each memory cell c[i,i'] may store data of one bit. FIG. 1*c* depicts an embodiment of the memory cell c[i,i']. As shown in FIG. 1*c*, the memory cell c[i,i'] may comprise transistors ga1[*i,i'*] and ga2[*i,i'*] (as pass-gate transistors), and transistors a1[*i,i'*] to a4[*i,i'*] (as storage transistors). The transistors ga1[*i,i'*], ga2[*i,i'*], a1[*i,i'*] and a2[*i,i'*] may be n-channel Metal-Oxide-Semiconductor (MOS) transistors, and the transistors a3[*i,i'*] and a4[*i,i'*] may be p-channel MOS transistors. The transistor ga1[i,i'] may comprise a controlled terminal and two channel terminals (e.g., a gate terminal, a drain terminal and a source terminal) respectively coupled to the word line WL[i], the bit line BL[i'] and a node na1[i,i']. The transistor ga2[i,i'] may comprise a controlled terminal and two channel terminals respectively coupled to the word line WL[i], the bit line BL'[i'] and another node na2[i,i']. The transistor a1[i,i'] may comprise a controlled terminal and two channel terminals (e.g., a gate terminal, a drain terminal and a source terminal) respectively coupled to the nodes na2[i,i'], na1[i,i'] and the ground voltage Gnd. The transistor a2[i,i'] may comprise a controlled terminal and two channel terminals respectively coupled to the nodes na1[i,i'], na2[i,i'] and the ground voltage Gnd. The transistor a3[i,i'] may comprise a controlled terminal and two channel terminals respectively coupled to the nodes na2[i,i'], na1[i,i'] and the supply voltage Vcc. The transistor a4[i,i'] may comprise a controlled terminal and two channel terminals respectively coupled to the nodes na1[i,i'], na2[i,i'] and the supply voltage Vcc. When the word line WL[i] is driven (i.e., when a voltage of the word line WL[i] is driven, from a level which may cause the transistors ga1[i,i'] and ga2[i,i'] to be turned off, to another level which may cause the transistors ga1[i,i'] and ga2[i,i'] to be turned on), the pass-gate transistors ga1[i,i'] and ga2[i,i'] may electrically connect (conduct) the nodes na1[i,i'] and na2[i,i'] (which may be referred to as two storage nodes) to the bit lines BL[i'] and BL'[i'], respectively. When the word line WL[i] is not driven, the pass-gate transistors ga1[i,i'] and ga2[i,i'] may not electrically connect the nodes na1[i,i'] and na2[i,i'] to the bit lines BL[i'] and BL'[i'].

Figure 1D:
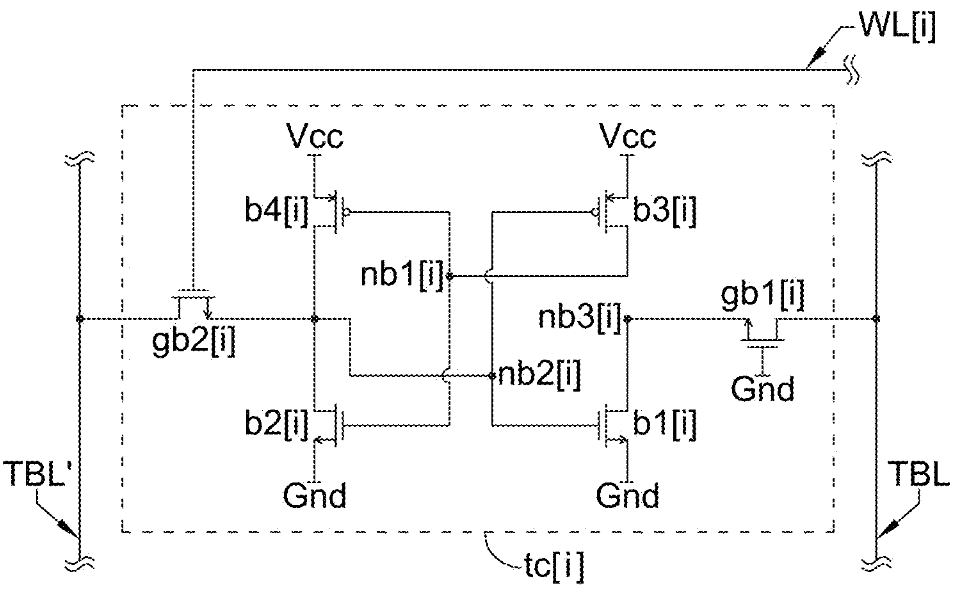
FIG. 1*d* depicts an embodiment of the tracking memory cell in FIG. 1*a;*

Referring back to FIG. 1a; in the circuit module 10 shown in FIG. 1a, each tracking memory cell tc[i] may reflect (track) electronic characteristics of each memory cell c[i,i']. FIG. 1d depicts an embodiment of the tracking memory cell tc[i]. As shown in FIG. 1d, the tracking memory cell tc[i] may comprise transistors gb1[i] and gb2[i] (as pass-gate transistors) and transistors b1[i] to b4[i] (as storage transistors). The transistors gb1[i], gb2[i], b1[i] and b2[i] may be n-channel MOS transistors, and the transistors b3[i] and b4[i] may be p-channel MOS transistors. The transistor gb1[i] may comprise a controlled terminal and two channel terminals respectively coupled to the ground voltage Gnd, the tracking bit line TBL and a node nb3[i]. The transistor gb2[i] may comprise a controlled terminal and two channel terminals respectively coupled to the word line WL[i], the tracking bit line TBL' and another node nb2[i]. The transistor b1[i] may comprise a controlled terminal and two channel terminals respectively coupled to the nodes nb2[i], nb3[i] and the ground voltage Gnd. The transistor b2[i] may comprise a controlled terminal and two channel terminals respectively coupled to a node nb1[i], the node nb2[i] and the ground voltage Gnd. The transistor b3[i] may comprise a controlled terminal and two channel terminals respectively coupled to the nodes nb2[i], nb1[i] and the supply voltage Vcc. The transistor b4[i] may comprise a controlled terminal and two channel terminals respectively coupled to the nodes nb1[i], nb2[i] and the supply voltage Vcc. When the word line WL[i] is driven, the pass-gate transistor gb2[i] may electrically connect (conduct) the node nb2[i] to the tracking bit line TBL'. When the word line WL[i] is not driven, the pass-gate transistors gb2[i] may not electrically connect the node nb2[i] to the tracking bit line TBL'.

In the tracking memory cell tc[i] shown in FIG. 1d and the memory cell c[i,i'] shown in FIG. 1c, the transistors b1[i] and b2[i] in FIG. 1d and the transistors a1[i,i'] and a2[i,i'] in FIG. 1c may be matched; for example, dimensions (e.g., channel lengths and/or widths, etc.) of the transistors b1[i], b2[i], a1[i,i'] and a2[i,i'] may be substantially equal, and doped areas for forming their channels may be formed by (on) the same semiconductor layer(s). And/or, the transistors b3[i] and b4[i] in FIG. 1d and the transistors a3[i,i'] and a4[i,i'] in FIG. 1c may be matched; for example, dimensions of the transistors b3[i], b4[i], a3[i,i'] and a4[i,i'] may be substantially equal, and doped areas for forming their channels may be formed by (on) the same semiconductor layer(s). And/or, the transistors gb1[i] and gb2[i] in FIG. 1d and the transistors ga1[i,i'] and ga2[i,i'] in FIG. 1c may be matched; for example, dimensions of the transistors gb1[i], gb2[i], ga1[i,i'] and ga2[i,i'] may be substantially equal, and doped areas for forming their channels may be formed by (on) the same semiconductor layer(s). By such transistor match arrangement, load on the tracking bit line TBL resulting from the tracking memory cells tc[1] to tc[I] may reflect load on the bit lines BL[i'] and BL'[i'] resulting from the memory cells c[1,i'] to c[I,i'].

Referring back to FIG. 1a; in the circuit module 10 shown in FIG. 1a, the control circuit 20 may control internal operation timing of the circuit module 10 according to the clock CK1. For example, when reading data stored in a certain memory cell c[i,i'], the control circuit 20 may start a read cycle under triggering of a rising edge of the clock CK1, may control the peripheral circuit 30 to electrically connect (conduct) the corresponding bit lines BL[i'] and BL'[i'] to a sensing amplifier sa[j] of the sensing amplifiers sa[1] to sa[J], to drive the tracking word line TWL, and to drive the word line WL[i]. As the word line WL[i] is driven, the memory cell c[i,i'] may be enabled, i.e., the pass-gate transistors ga1[i,i'] and ga2[i,i'] (FIG. 1c) in the memory cell c[i,i'] may electrically connect (conduct) the storage nodes na1[i,i'] and na2[i,i'] to the corresponding bit lines BL[i'] and BL'[i'] respectively. After the tracking word line TWL is driven and the word line WL[i] is driven, the control circuit 20 may further provide a signal s1 according to response characteristics of the node n1 (such as time for the voltage at the node n1 to change from a certain level to another level), and may thereby control operation timing of the sensing amplifiers sa[1] to sa[J] in the functional circuit 40, e.g., when to enable the sensing amplifiers sa[1] to sa[J] to start sensing, and when to disable the sensing amplifiers sa[1] to sa[J] to stop sensing. After the memory cell c[i,i'] is enabled, when the control circuit 20 enables the sensing amplifiers sa[1] to sa[J] by the signal s1, the sensing amplifier sa[j] may sense data stored in the memory cell c[i,i'] via the bit lines BL[i'] and BL'[i']. There may be a time difference between "time to drive the word line WL[i] for enabling the memory cell c[i,i']" and "time to enable the sensing amplifier sa[i]," and the time difference may be referred to as a memory cell read time.

To correctly sense data of the bit lines BL[i'] and BL'[i'], the operation timing of the sensing amplifier sa[j] (e.g., when to be enabled and/or disabled) needs to be coordinate with response of the bit lines BL[i'] and BL'[i'] caused by the memory cell c[i,i'] after the word line WL[i] is driven. Under arrangement of the invention, response characteristics of the tracking bit lines TBL and TBL' after the tracking word line TWL is driven may reflect the response of the bit lines BL[i'] and BL'[i'] caused by the memory cell c[i,i'] after the word line WL[i] is driven, so when the control circuit 20 controls the sensing amplifier sa[j] in the functional circuit 40 according to the response characteristics of the node n1, the control circuit 20 may cause the operation timing of the sensing amplifier sa[j] to be coordinate with the response of the bit lines BL[i'] and BL'[i'].

However, as depicted in FIG. 1*b*, the circuit module 10 may operate in different modes; under different modes, the period values of the clock CK1 and the voltage values of the supply voltage Vcc may differ. Hence, the internal operation timing of the circuit module 10 and one or more related timing parameters, such as aforementioned memory cell read time, may need to be dynamically and adaptively adjusted, so the circuit module 10 may correctly operate under the different modes. For example, when the period value of the clock CK1 is shorter and/or the voltage value of the supply voltage Vcc is higher (e.g., during the time points tb0 to tb1 in FIG. 1*b*), the memory cell read time may be set as a shorter interval; on the other hand, when the period value of the clock CK1 is longer and/or the voltage value of the supply voltage Vcc is lower (e.g., during the time points tb3 to tb4 in FIG. 1*b*), the memory cell read time may be set as a longer interval. In addition, the internal operation timing and the related timing parameter(s) of the circuit module 10 may also need adjustment for other consideration(s), such as fabrication process drifts. In the circuit module 10 (FIG. 1*a*) of the invention, the auxiliary circuit set 100 coupled to the node n1 may change and/or adjust the response characteristics of the node n1 according to different needs (e.g., different modes and/or different process drifts). Thus, when the control circuit 20 controls the operation timing of the functional circuit 40 according to the response characteristics of the node n1, the control circuit 20 may adaptively and dynamically adjust the operation timing and the related timing parameter(s), such as the memory cell read time, according to different needs.

Figure 2:
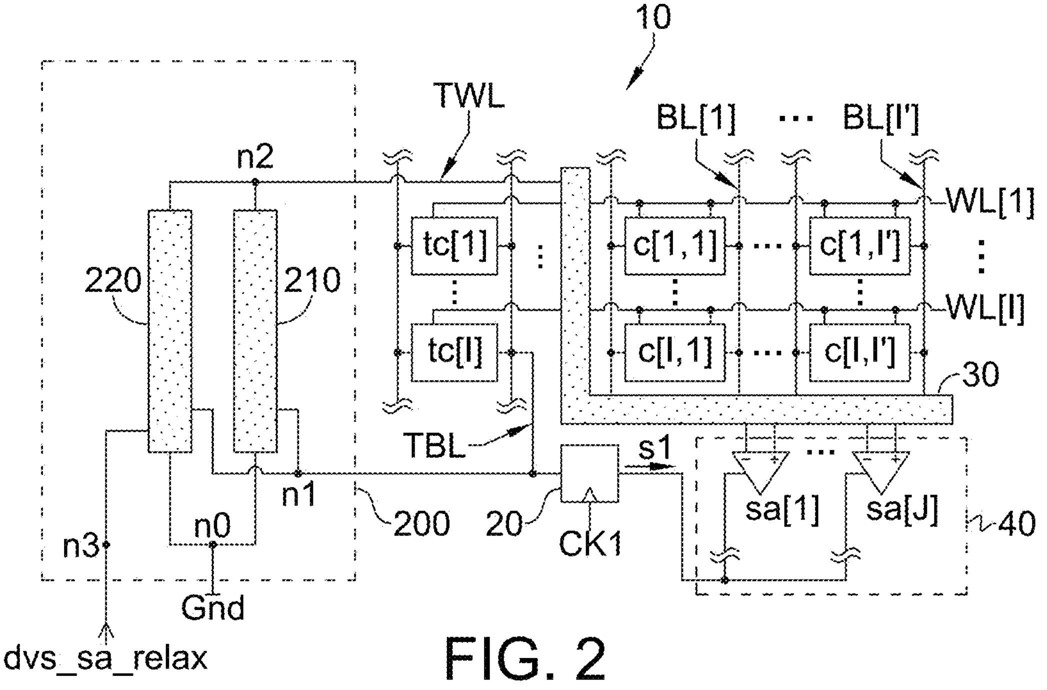
FIG. 2 depicts an auxiliary circuit set according to an embodiment of the invention, wherein the auxiliary circuit set may implement the auxiliary circuit set in FIG. 1*a*, and may include two auxiliary circuits.

FIG. 2 depicts an auxiliary circuit set 200 according to an embodiment of the invention; the auxiliary circuit set 200 may implement the auxiliary circuit set 100 in the circuit module 10 shown in FIG. 1*a*. As shown in FIG. 2, the auxiliary circuit set 200 may comprise two auxiliary circuits 210 and 220. The auxiliary circuit 210 may be a main auxiliary circuit, and may be coupled to the ground voltage Gnd, the tracking bit line TBL and the tracking word line TWL respectively at the nodes n0, n1 and n2. The auxiliary circuit 220 may be an additional auxiliary circuit, and may be coupled to the ground voltage Gnd, the tracking bit line TBL, the tracking word line TWL and the signal dvs_sa_relax respectively at the nodes n0, n1, n2 and n3.

In an embodiment, the auxiliary circuit 210 may be enabled when the tracking word line TWL is driven. When the auxiliary circuit 210 is enabled, the auxiliary circuit 210 may provide one or more main conduction paths shunt between the nodes n1 and no. When the tracking word line TWL is driven, if the signal dvs_sa_relax is of the level v0 (FIG. 1*b*), the auxiliary circuit 220 may be enabled, and may provide one or more additional conduction paths shunt between the nodes n1 and n0; the one or more additional conduction paths and the one or more main conduction paths may be parallel (shunt). On the other hand, when the tracking word line TWL is driven, if the signal dvs_sa_relax is of the level v1 (FIG. 1*b*), the auxiliary circuit 220 may be disabled, and may not provide the one or more additional conduction paths between the nodes n1 and no.

Figure 3A:
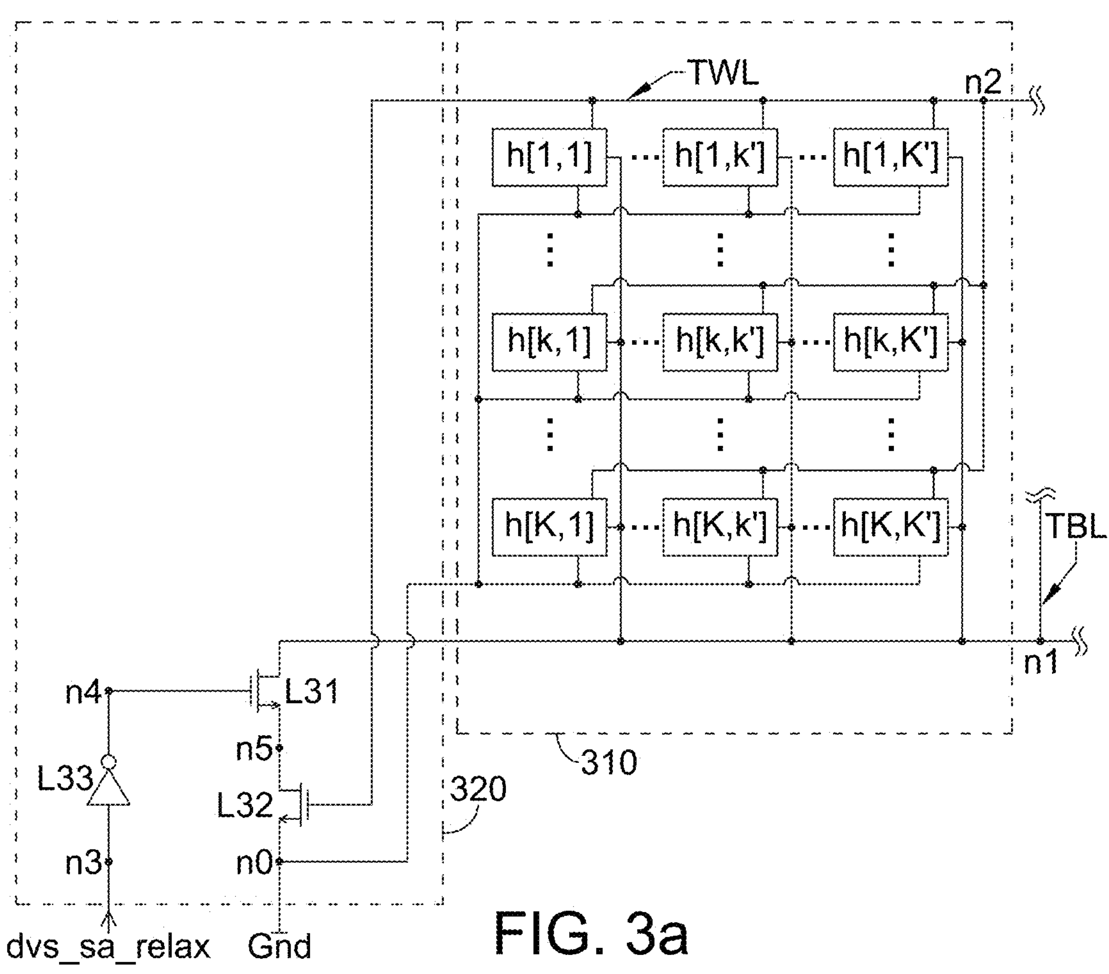
FIG. 3*a* depicts two auxiliary circuits according to an embodiment of the invention, wherein the two auxiliary circuits may respectively implement the two auxiliary circuits in FIG. 2, and may include one or more modified memory cells.

FIG. 3*a* depicts auxiliary circuits 310 and 320 according to an embodiment of the invention; the auxiliary circuits 310 and 320 may respectively implement the auxiliary circuits 210 and 220 shown in FIG. 2. As shown in FIG. 3*a*, the auxiliary circuit 310 may comprise number K*K' of modified memory cell(s) h[1,1] to h[K,K'], wherein each of the numbers K and K' may be a constant integer greater than or equal to one. Each modified memory cell h[k,k'] (for indices k=1 to K and k'=1 to K') may be coupled to the nodes n0, n1 and n2.

Figure 3B:
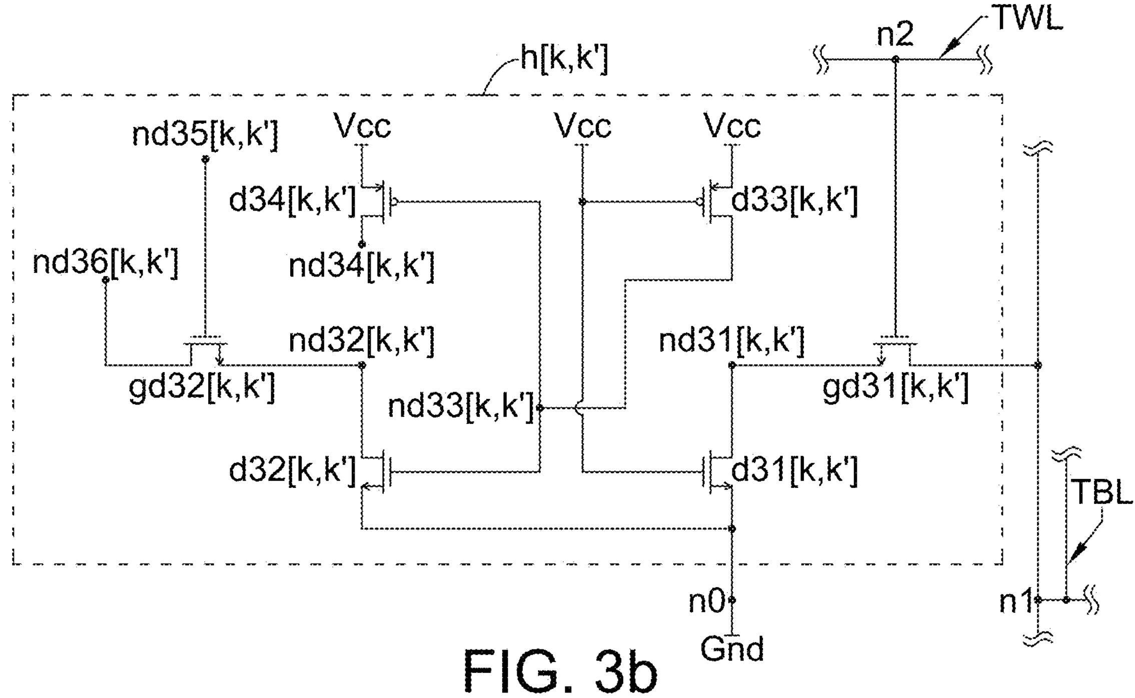
FIG. 3*b* depicts an embodiment of the modified memory cell in FIG. 3*a;*

FIG. 3*b* depicts an embodiment of the modified memory cell h[k,k'] in FIG. 3*a*. The modified memory cell h[k,k'] may comprise transistors gd31[*k,k*'] and gd32[*k,k*'], and transistors d31[*k,k*'] to d34[*k,k*']. The transistors gd31[*k,k*'], gd32[*k,k*'], d31[*k,k*'] and d32[*k,k*'] may be n-channel MOS transistors, and the transistors d33[*k,k*'] and d34[*k,k*'] may be p-channel MOS transistors. The transistor gd31[*k,k*'] may be a pass-gate transistor, and may comprise a controlled terminal and two channel terminals (e.g., a gate terminal, a drain terminal and a source terminal) respectively coupled to the node n2 (the tracking word line TWL), the node n1 (the tracking bit line TBL) and a node nd31[*k,k*']. The transistor gd32[*k,k*'] may comprise a controlled terminal and two channel terminals respectively coupled to three nodes nd35[*k,k*'], nd36[*k,k*'] and nd32[*k,k*']. The transistor d31[*k,k*'] may be a storage transistor, and may comprise a controlled terminal and two channel terminals (e.g., a gate terminal, a drain terminal and a source terminal) respectively coupled to the supply voltage Vcc, the node nd31[*k,k*'] and the node n0 (the ground voltage Gnd). The transistor d32[*k,k*'] may comprise a controlled terminal and two channel terminals respectively coupled to a node nd33[*k,k*'], the node nd32[*k,k*'] and the node n0. The transistor d33[*k,k*'] may comprise a controlled terminal and two channel terminals (e.g., a gate terminal, a drain terminal and a source terminal) respectively coupled to the supply voltage Vcc, the node nd33[*k,k*'] and the supply voltage Vcc. The transistor d34[*k,k*'] may comprise a controlled terminal and two channel terminals respectively coupled to the node nd33[*k,k*'], another node nd34[*k,k*'] and the supply voltage Vcc. The nodes nd31[*k,k*'] to nd34[*k,k*'] may be mutually insulated. In an embodiment, the number I (FIG. 1*a*) and the number K (FIG. 3*a*) may be equal, and the node nd35[*k,k*'] may be coupled to the word line WL[k], for index k=1 to K. In an embodiment, the node nd36[*k,k*'] may be left float.

In the modified memory cell h[k,k'], when the tracking word line TWL is driven, the transistor gd3[*k,k*'] may electrically connect (conduct) the node n1 to the node nd31[*k,k*']; because the controlled terminal (e.g., the gate terminal) of the transistor d31[*k,k*'] is coupled to the supply voltage Vcc, the transistor d31[*k,k*'] may electrically connect (conduct) the node nd31[*k,k*'] to the node no. Hence, in the modified memory cell h[k,k'], when the tracking word line TWL is driven, the transistors gd31[*k,k*'] and d31[*k,k*'] may be turned on to jointly provide a conduction path between the nodes n1 and no. On the other hand, when the tracking word line TWL is not driven, the transistor gd31[*k,k*'] may be turned off to stop conduction, and the modified memory cell h[k,k'] may not provide the conduction path between the nodes n1 and n0.

Based on the operation of each modified memory cell h[k,k'], when the tracking word line TWL is driven, the auxiliary circuit 310 (FIG. 3*a*) may be enabled, and the modified memory cell(s) h[1,1] to h[K,K'] may provide number K*K' of conduction path(s) shunt between the nodes n1 and no as main conduction path(s). When the tracking word line TWL is not driven, the auxiliary circuit 310 may be disabled, and may not provide the K*K' conduction path(s) between the nodes n1 and n0.

In the modified memory cell h[k,k'] shown in FIG. 3*b* and the memory cell c[i,i'] shown in FIG. 1*c*, the transistors d31[*k,k*'] and d32[*k,k*'] in FIG. 3*b* and the storage transistors a1[*i,i*'] and a2[*i,i*'] in FIG. 1*c* may be matched; for example, dimensions (e.g., channel lengths and/or widths, etc.) of the transistors d31[k,k'], d32[k,k'], a1[i,i'] and a2[i,i'] may be substantially equal, and doped areas for forming their channels may be formed by (on) the same semiconductor layer(s). And/or, the transistors d33[k,k'] and d34[k,k'] in FIG. 3b and the storage transistors a3[i,i'] and a4[i,i'] in FIG. 1c may be matched; for example, dimensions of the transistors d33[k,k'], d34[k,k'], a3[i,i'] and a4[i,i'] may be substantially equal, and doped areas for forming their channels may be formed by (on) the same semiconductor layer(s). And/or, the transistors gd31[k,k'] and gd32[k,k'] in FIG. 3b and the pass-gate transistors ga1[i,i'] and ga2[i,i'] in FIG. 1c may be matched; for example, dimensions of the transistors gd31[k,k'], gd32[k,k'], ga1[i,i'] and ga2[i,i'] may be substantially equal, and doped areas for forming their channels may be formed by (on) the same semiconductor layer(s). That is, the transistors in the modified memory cell h[k,k'] and the transistors in the memory cell c[i,i'] may be of same specification, same structures and same electronic characteristics. On the other hand, as shown in FIG. 1c and FIG. 3b, interconnection between transistors in the memory cell c[i,i'] and interconnection between transistors in the modified memory cell h[k,k'] may be different; for example, in FIG. 1c, the drain terminal of the transistor a1[i,i'] may be coupled to the drain terminal of the transistor a3[i,i'], and the gate terminal of the a1[i,i'] may be insulated from the supply voltage Vcc; in FIG. 3b, the drain terminal of the transistor d31[k,k'] may be insulated from the drain terminal of the transistor d33[k,k'], and the gate terminal of the transistor d31[k,k'] may be coupled to the supply voltage Vcc.

Referring back to FIG. 3a; as shown in FIG. 3a, the auxiliary circuit 320 may comprise an inverter L33 and two transistors L31 and L32. The transistors L31 and L32 may be n-channel MOS transistors. The transistor L31 may comprise a controlled terminal and two channel terminals (e.g., a gate terminal, a drain terminal and a source terminal) respectively coupled to a node n4, the node n1 (the tracking bit line TBL) and another node n5. The transistor L32 may comprise a controlled terminal and two channel terminals respectively coupled to the node n2 (the tracking word line TWL), the node n5 and the node n0 (the ground voltage Gnd). The inverter L33 may comprise an input terminal and an output terminal respectively coupled to the nodes n3 and n4. When the tracking word line TWL is driven, if the signal dvs_sa_relax is of the level v0, the transistors L31 and L32 may be turned on, the auxiliary circuit 320 may be enabled, and may provide a conduction path between the nodes n1 and no as an additional conduction path. When the tracking word line TWL is driven, if the signal dvs_sa_relax is of the level v1, the transistor L31 may be off, the auxiliary circuit 320 may be disabled, and may not provide the conduction path between the nodes n1 and no. When the tracking word line TWL is driven, if the signal dvs_sa_relax changes from the level v0 to the level v1, the additional auxiliary circuit 320 may change from being enabled (providing the conduction path) to being disabled (not providing the conduction path). When the tracking word line TWL is driven, if the signal dvs_sa_relax changes from the level v1 to the level v0, the additional auxiliary circuit 320 may change from being disabled (not providing the conduction path) to being enabled (providing the conduction path). When the tracking word line TWL is not driven, the auxiliary circuit 320 may be disabled.

In an embodiment of the invention, channel doped areas of the transistors L31 and L32 and channel doped areas of the transistors d31[k,k'] and d32[k,k'] (FIG. 3b) may be formed by (on) different semiconductor layers. The transistors d31[k,k'] and d32[k,k'] may be transistors for constructing memory cells, and the transistors L31 and L32 may be transistors for constructing logic gates.

Figure 3C:
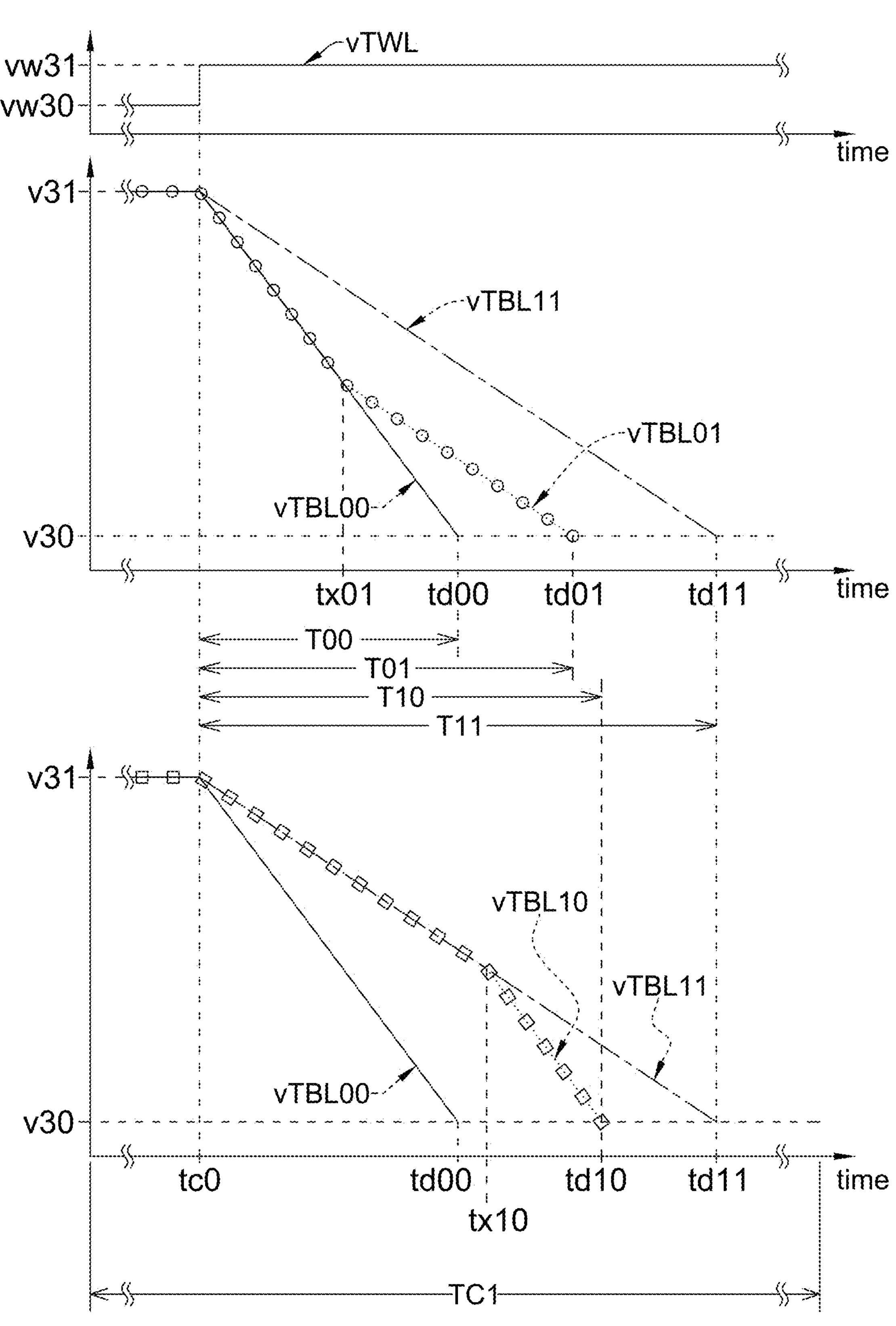
FIG. 3*c* depicts waveform and timing embodiments of related signals in FIG. 3*a* under different scenarios.

FIG. 3c depicts waveform and timing embodiments of related signals in FIG. 3a, wherein a waveform vTWL may represent a voltage of the tracking word line TWL, and waveforms vTBL00, vTBL01, vTBL10 and vTBL11 may represent voltage responses of the tracking bit line TBL respectively in various scenarios. As shown in FIG. 3c, in an operation cycle TC1 (e.g., a read cycle which may last as long as one period T of the clock CK1 in FIG. 1b) of the circuit module 10, the voltage of the tracking word line TWL may be driven from a level vw30 to another level vw31 at a time point tc0, as depicted by the waveform vTWL, wherein the level vw31 may be a level which may cause the transistors L32 (FIG. 3a) and gd31[k,k'] (FIG. 3b) to be turned on, and the level vw30 may be a level which may cause the transistors L32 and gd31[k,k'] to be turned off.

After the time point tc0, as the tracking word line TWL is driven, the voltage of the tracking bit line TBL at the node n1 may start to change (e.g., to fall) from a level v31. Wherein time (duration) for the voltage of the tracking bit line TBL to change from the level v31 to another different level v30 may be considered as a response parameter of the response characteristics of the node n1, and may be referred to as a tracking bit line discharge time hereinafter; the level v31 may be referred to as an initial level. After the time point tc0, the control circuit 20 may control the operation timing of the functional circuit 40 and/or the circuit module 10 according to the response characteristics of the node n1, such that one or more timing parameters (e.g., time length of the memory cell read time) of the operation timing may relate to one or more response parameters (e.g., time length of the tracking bit line discharge time) of the response characteristics. Furthermore, as the tracking word line TWL is driven after the time point tc0, the auxiliary circuit 310 may be enabled after the time point tc0, and the modified memory cell(s) h[1,1] to h[K,K'] may provide K*K' conduction path(s) as main conduction path(s) between the nodes n1 and n0.

In a first scenario, when the tracking word line TWL is driven after the time point tc0 and therefore causes the auxiliary circuit 310 to be enabled, the signals dvs_sa_relax may stay at the level v0, and may therefore cause the auxiliary circuit 320 to be enabled. As a result, after the time point tc0, not only the auxiliary circuit 310 may provide the main conduction path(s) between the nodes n1 and no, but the transistors L31 and L32 which are turned on within the auxiliary circuit 320 may also provide an additional conduction path shunt with the main conduction path(s) between the nodes n1 and n0. Via the main conduction path(s) and the additional conduction path jointly provided by the auxiliary circuits 310 and 320, the tracking bit line TBL coupled to the node n1 may discharge to the node no from the level v31 since the time point tc0, and may reach the level v30 at a time point td00, as demonstrated by the waveform vTBL00. In this first scenario, the tracking bit line discharge time may equal a time value T00 (from time points tc0 to td00).

In a second scenario, when the tracking word line TWL is driven after the time point tc0 and therefore causes the auxiliary circuit 310 to be enabled, the signals dvs_sa_relax may change from the level v0 to the level v1 at a certain time point tx01, and may therefore cause the auxiliary circuit 320 to change from being enabled to being disabled at the time point tx01. As a result, during the time points tc0 to tx01, both the auxiliary circuits 310 and 320 may be enabled; via the main conduction path(s) and the additional conduction path jointly provided by the auxiliary circuits 310 and 320, the tracking bit line TBL coupled to the node n1 may start to discharge to the node no from the level v31 at the time point tc0. After the time point tx01, the auxiliary circuit 320 may be disabled and may stop providing the additional conduction path, but the auxiliary circuit 310 may remain enabled; via the main conduction path(s) provided by the auxiliary circuit 310, the tracking bit line TBL may continue to discharge to the node n0, and may reach the level v30 at a time point td01, as demonstrated by the waveform vTBL01. In this second scenario, the tracking bit line discharge time may equal a time value T01 (from time points tc0 to td01).

In a third scenario, when the tracking word line TWL is driven after the time point tc0 and therefore causes the auxiliary circuit 310 to be enabled, the signals dvs_sa_relax may change from the level v1 to the level v0 at a certain time point tx10, and may therefore cause the auxiliary circuit 320 to change from being disabled to being enabled at the time point tx10. As a result, during the time points tc0 to tx10, the auxiliary circuits 310 and 320 may respectively be enabled and disabled; via the main conduction path(s) provided by the auxiliary circuit 310, the tracking bit line TBL coupled to the node n1 may start to discharge to the node no from the level v31 at the time point tc0. After the time point tx10, both the auxiliary circuits 310 and 320 may be enabled; via the main conduction path(s) and the additional conduction path collectively provided by the auxiliary circuits 310 and 320, the tracking bit line TBL may continue to discharge to the node n0, and may reach the level v30 at a time point td10, as demonstrated by the waveform vTBL10. In this third scenario, the tracking bit line discharge time may equal a time value T10 (from time points tc0 to td10).

In a fourth scenario, when the tracking word line TWL is driven after the time point tc0 and therefore causes the auxiliary circuit 310 to be enabled, the signals dvs_sa_relax may stay at the level v1, and may therefore cause the auxiliary circuit 320 to be disabled. As a result, after the time point tc0, the auxiliary circuits 310 and 320 may respectively be enabled and disable; via the main conduction path(s) provided by the auxiliary circuit 310, the tracking bit line TBL coupled to the node n1 may discharge to the node no from the level v31 since the time point tc0, and may reach the level v30 at a time point td11, as demonstrated by the waveform vTBL11. In this fourth scenario, the tracking bit line discharge time may equal a time value T11 (from time points tc0 to td11).

As shown in FIG. 1*b*, the level of the signal dvs_sa_relax may reflect the operation modes of the circuit module 10. Therefore, in the aforementioned first and fourth scenarios, the circuit module 10 respectively stays in two different modes during one same operation cycle TC1, while in the second and third scenarios, the circuit module 10 switches between different modes during the same operation cycle TC1. As demonstrated by the waveforms vTBL00, vTBL01, vTBL10 and vTBL11 (respectively corresponding to the first to fourth scenarios), the response characteristics of the tracking bit line TBL (the node n1) may adaptively change in the first to fourth scenarios; for example, the tracking bit line discharge time may respectively be the time values T00, T01, T10 and T11. Because the control circuit 20 (FIG. 1*a*) is arranged to control the operation timing of the functional circuit 40 according to the response characteristics of the node n1, the control circuit 20 may dynamically adjust the operation timing and the related timing parameter(s) of the functional circuit 40 and/or the circuit module 10, such as the memory cell read time, for adaptation of different scenarios (modes). For example, according to the tracking bit line discharge time, the control circuit 20 may control when each sensing amplifier sa[j] should be enabled, as well as how long the memory cell read time should be, e.g., may cause the memory cell read time to be positively correlated to the tracking bit line discharge time; as the tracking bit line discharge time becomes longer, the memory cell read time may be longer.

Besides, as previously described, the transistor d31[*k,k*'] in each modified memory cell h[k,k'] (FIG. 3*b*) and the transistor a1[*i,i*'] in each memory cell c[i,i'] (FIG. 1*c*) may have the same structure and characteristics, the transistors gd31[*k,k*'] (FIG. 3*b*) and ga1[*i,i*'] (FIG. 1*c*) may also have the same structure and characteristics. Under such arrangements, when each modified memory cell h[k,k'] provides the conduction path at the node n1, effects of the conduction path on the tracking bit line TBL may reflect effects of each memory cell c[i,i'] on the bit lines BL[i'] and BL'[i'] (FIG. 1*a*). If the characteristics of each memory cell c[i,i'] is affected by process drifts, effects of each memory cell c[i,i'] acting on the bit lines BL[i'] and BL'[i'] when the word line WL[i] is driven may also be affected; however, the characteristics of each modified memory cell h[k,k'] may similarly be affected. Consequently, when the tracking word line TWL is driven, the effects of each modified memory cell h[k,k'] on the tracking bit line TBL and the response characteristics of the node n1 may reflect influence of the process drifts. When the control circuit 20 (FIG. 1*a*) controls the operation timing of each sensing amplifier sa[j] in the functional circuit 40 according to the response characteristics of the node n1, the operation timing and related timing parameter(s) (e.g., the memory cell read time) may therefore adaptively reflect influence of the process drifts. As a result, each sensing amplifier sa[j] may correctly sense data stored by each corresponding memory cell c[i,i'] even if each memory cell c[i,i'] is affected by the process drifts.

Moreover, as demonstrated by the waveforms vTBL00, vTBL01, vTBL10 and vTBL11 (respectively corresponding to the first to fourth scenarios), it is understood that, under operation arrangement of the auxiliary circuits 310 and 320 (FIG. 3*a*), regardless of how the signal dvs_sa_relax becomes during one same operation cycle TC1 (whether the signal dvs_sa_relax stays at the level v0, stays at the level v1, changes from the levels v0 to v1 at any time point, or changes from the levels v1 to v0 at any time point), the voltage response waveform of the tracking bit line TBL (the node n1) may be enveloped between the waveforms vTBL00 and vTBL11, and the corresponding tracking bit line discharge time may fall between the time values T00 and T11. During discharge of the tracking bit line TBL from the levels v31 to v30, because the tracking bit line TBL may keep discharging via more conduction paths (the main conduction path(s) and the additional conduction path) in the first scenario, and may keep discharging via fewer conduction path(s) (only the main conduction path(s)) in the fourth scenario, the tracking bit line discharge time may equal the shortest time value T00 in the first scenario, and may equal the longest time value T11 in the fourth scenario; in the second and third scenarios, the tracking bit line TBL may discharge via more conduction paths during a portion of the time and may discharge via fewer conduction path(s) during another portion of the time, so the tracking bit line discharge time (the time values T01 and T10) may be between the time values T00 and T11.

In other words, under operation arrangement of the auxiliary circuits 310 and 320 of the invention, regardless of whether the circuit module 10 stays in anyone of the modes or changes between the modes during one same operation cycle TC1, the response parameter(s) related to the response characteristics of the node n1 may fall into definite (well-defined) corresponding response parameter range(s); for example, the tracking bit line discharge time may fall into the range between the time values T00 and T11. In association with the definite response parameter range(s) of the response parameter(s), when the control circuit 20 (FIG. 1*a*) controls the operation timing of the functional circuit 40 according to the response characteristics of the node n1, the timing parameter(s) related to the operation timing may also have definite corresponding timing parameter range(s); for example, the memory cell read time may fall into a definite time range. Therefore, by ensuring that margin(s) of the timing parameter(s) related to the operation timing of the functional circuit 40 may cover said corresponding timing parameter range(s) of the timing parameter(s), the functional circuit 40 may correctly operate regardless of whether the functional circuit 40 stays in anyone of the modes or changes between the modes during one same operation cycle TC1.

In conventional art, a conventional circuit module comprises distinct mode-specific circuits respectively for the different modes, and an operation timing of an internal functional circuit of the conventional circuit module depends on which one of the mode-specific circuits is enabled. For example, the conventional circuit module would include a first mode-specific circuit and a second mode-specific circuit respectively for a first mode and a second mode. When the conventional circuit module operates in the first mode, the first mode-specific circuit is enabled, the second mode-specific circuit is disabled, and the operation timing of the functional circuit depends on the first mode-specific circuit; for example, the first mode-specific circuit causes a timing parameter related to the operation timing to equal a first value. When the conventional circuit module operates in the second mode, the first mode-specific circuit is disabled, the second mode-specific circuit is enabled, and the operation timing of the functional circuit depends on the second mode-specific circuit; for example, the second mode-specific circuit causes said timing parameter to equal a second value.

However, such conventional art suffers many disadvantages. For example, to completely switch from the first mode to the second mode (or from the second mode to the first mode) will take a mode switch time (duration). During the mode switch time, whether the first mode-specific circuit and the second mode-specific circuit are enabled or disabled is unpredictable and stochastic; ideally, one is enabled when the other is disabled, but it is possible that, for a portion of the mode switch time, the two mode-specific circuits are both enabled, both disabled, or the one which should be enabled is not enabled and the one which should be disabled is not disabled, etc. Owing to uncertainty during the mode switch time, each timing parameter related to the operation timing does not have definite corresponding timing parameter range. For example, if the first mode-specific circuit and the second mode-specific circuit are both enabled, it is difficult to know whether said timing parameter equals the first value, the second value or another value.

Besides, each mode-specific circuit also needs a transient time to transit from being enabled to being completely disabled, or to transit from being disabled to being completely enabled. During aforementioned mode switch time, even if the two mode-specific circuits correctly transit from being enabled to being disabled and from being disabled to being enabled, the two mode-specific circuits will unpredictably affect operation of the conventional circuit module during the transient time. For example, when the conventional circuit module switches from the first mode to the second mode, ideally said timing parameter should switch to the second value, but said timing parameter will not equal the second value and the first value if the first mode-specific circuit is not completely disabled when the second mode-specific circuit is enabled.

To prevent uncertainty caused by aforementioned mode switch and transient, the conventional art configures the conventional circuit module to suspend (pause) normal operation of the circuit module when switching between the modes, and to resume normal operation after the mode switch completes. For example, the conventional circuit module will switch mode after a normal operation cycle ends, stop executing any operation of normal operation cycle during the mode switch, and proceed to a subsequent normal operation cycle after the mode-specific circuits are correctly enabled and disabled. Such conventional art suffers from lower operation efficiency since the conventional circuit module needs to stop normal operation during mode switch.

On the other hand, according to the invention, though the timing parameter(s) related to control of the operation timing may depend on the auxiliary circuits 310 and 320, enabling and disabling of the auxiliary circuits 310 and 320 may not be mutually exclusive. When the control circuit 20 controls the operation timing, the auxiliary circuit 310 may remain enabled, while the auxiliary circuit 320 may be enabled or disabled in response to different levels (relating to different modes) of the signal dvs_sa_relax.

Under such arrangement, the timing parameter(s) related to control of the operation timing may have definite timing parameter range(s), and the invention may therefore prevent disadvantages of the conventional art that the uncertainty and transient, which occur when the different mode-specific circuits of the conventional circuit module transit between being enabled and disabled, will cause infeasibility to reliably and definitely determine the timing parameter range(s). In the invention, even if the signal dvs_sa_relax changes levels in a same operation cycle TC1 (the operation mode switches in a same operation cycle TC1), the functional circuit 40 and the circuit module 10 may remain normal operations (e.g., data sensing, reading) in that operation cycle TC1, without compromising operation correctness of that operation cycle TC1 (e.g., correctness of data sensing).

Figure 4A:
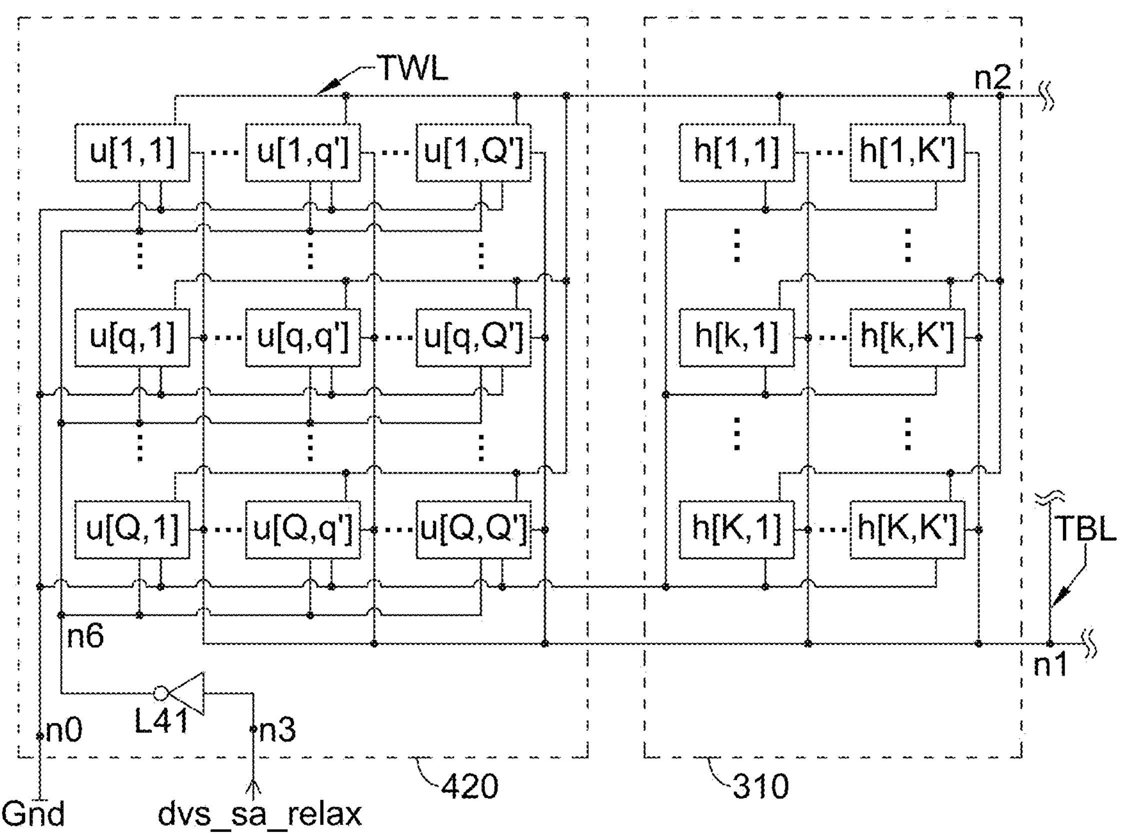
FIG. 4*a* depicts two auxiliary circuits according to an embodiment of the invention, wherein the two auxiliary circuits may respectively implement the two auxiliary circuits in FIG. 2, and may include one or more modified memory cells.

FIG. 4*a* depicts an auxiliary circuit 420 according to an embodiment of the invention; the auxiliary circuit 420 and the auxiliary circuit 310 in FIG. 3*a* (also reproduced in FIG. 4*a*) may cooperate to respectively implement the auxiliary circuits 220 and 210 in FIG. 2. As shown in FIG. 4*a*, the auxiliary circuit 420 may comprise number Q*Q' modified memory cell(s) u[1,1] to u[Q,Q'], and an inverter L41; each of the numbers Q and Q' may be a constant integer greater than or equal to one. The inverter L41 may comprise an input terminal and an output terminal respectively coupled to the node n3 and another node n6. Each modified memory cell u[q,q'] (for indices q=1 to Q and q'=1 to Q') may be coupled to the node n0 (the ground voltage Gnd), the node n1 (the tracking bit line TBL), the node n2 (the tracking word line TWL) and the node n6 (the output terminal of the inverter L41).

Figure 4B:
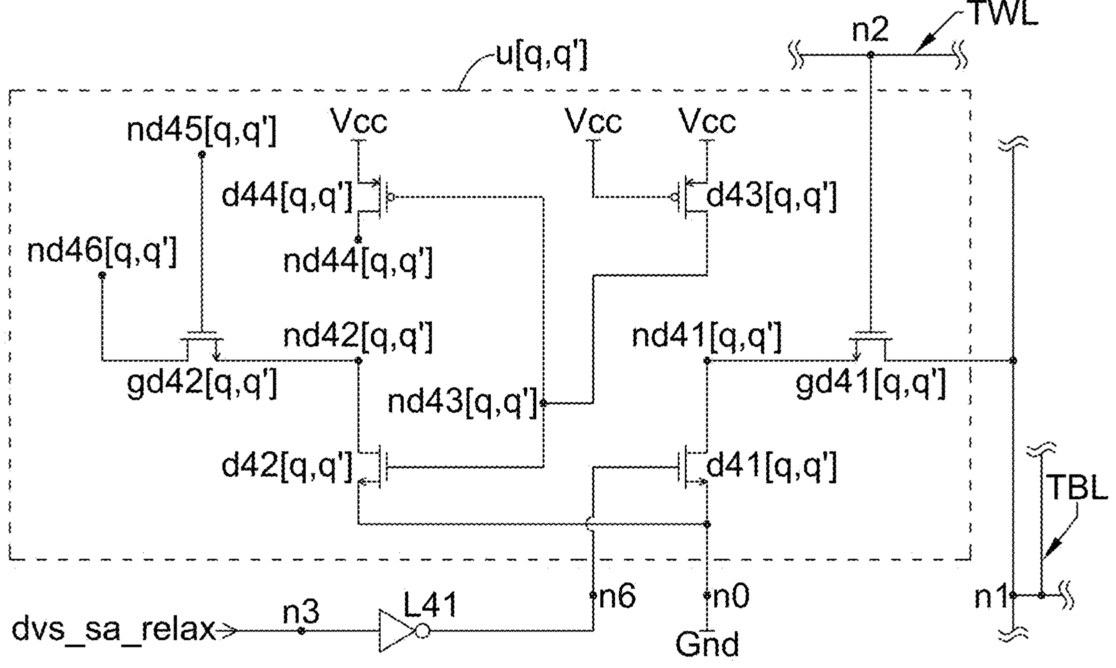
FIG. 4*b* depicts an embodiment of the modified memory cell in FIG. 4*a;*

FIG. 4*b* depicts an embodiment of the modified memory cell u[q, q'] in FIG. 4*a*. The modified memory cell u[q, q'] may comprise transistors gd41[*q,q*'] and gd42[*q,q*'], and transistors d41[*q,q*'] to d44[*q,q*']. The transistors gd41[*q,q*'], gd42[*q,q*'], d41[*q,q*'] and d42[*q,q*'] may be n-channel MOS transistors, and the transistors d43[*q,q*'] and d44[*q,q*'] may be p-channel MOS transistors. The transistor gd41[q,q'] may be a pass-gate transistor, and may comprise a controlled terminal and two channel terminals (e.g., a gate terminal, a drain terminal and a source terminal) respectively coupled to the node n2 (the tracking word line TWL), the node n1 (the tracking bit line TBL) and a node nd41[q,q']. The transistor gd42[q,q'] may comprise a controlled terminal and two channel terminals respectively coupled to three nodes nd45[q,q'], nd46[q,q'] and nd42[q,q']. The transistor d41[q,q'] may be a storage transistor, and may comprise a controlled terminal and two channel terminals (e.g., a gate terminal, a drain terminal and a source terminal) respectively coupled to the nodes n6, nd41[q,q'] and n0 (the ground voltage Gnd). The transistor d42[q,q'] may comprise a controlled terminal and two channel terminals respectively coupled to a node nd43[q,q'], the node nd42[q,q'] and the node no. The transistor d43[q,q'] may comprise a controlled terminal and two channel terminals (e.g., a gate terminal, a drain terminal and a source terminal) respectively coupled to the supply voltage Vcc, the node nd43[q,q'] and the supply voltage Vcc. The transistor d44[q,q'] may comprise a controlled terminal and two channel terminals respectively coupled to the node nd43[q,q'], another node nd44[q,q'] and the supply voltage Vcc. The nodes nd41[q,q'] to nd44[q,q'] may be mutually insulated. In an embodiment, the number I (FIG. 1a) and the number Q (FIG. 4a) may be equal, and the node nd45[q,q'] may be coupled to the word line WL[q], for index q=1 to Q. In an embodiment, the node nd46[q,q'] may be left float.

In the modified memory cell u[q,q'], when the tracking word line TWL is driven, if the signal dvs_sa_relax is of the level v0, the transistors gd41[q,q'] and d41[q,q'] may be turned on, and may provide a conduction path between the nodes n1 and no. On the other hand, when the tracking word line TWL is driven, if the signal dvs_sa_relax is of the level v1, the transistor d41[q,q'] may be turned off, and the modified memory cell u[q, q'] may not provide the conduction path between the nodes n1 and n0. When the tracking word line TWL is not driven, the transistor gd41[q,q'] may be turned off, and the modified memory cell u[q,q'] may not provide the conduction path between the nodes n1 and n0.

Based on the operation of each modified memory cell u[q, q'], when the tracking word line TWL is driven, if the signal dvs_sa_relax is of the level v0, the auxiliary circuit 420 (FIG. 4a) may be enabled, and the modified memory cell(s) u[1,1] to u[Q,Q'] may provide Q*Q' shunt conduction path(s) between the nodes n1 and no as additional conduction path(s). When the tracking word line TWL is driven, if the signal dvs_sa_relax is of the level v1, the auxiliary circuit 420 may be disabled, and may not provide the Q*Q' conduction path(s) between the nodes n1 and n0. When the tracking word line TWL is not driven, the auxiliary 420 may also be disabled.

In other words, the auxiliary circuit 420 in FIG. 4a and the auxiliary circuit 320 in FIG. 3a may have the same functionality. When the tracking word line TWL is driven, the auxiliary circuit 310 may remain enabled to provide the main conduction path(s), and the auxiliary circuit 420 may be enabled or disabled according to whether the signal dvs_sa_relax is of the level v0 or v1; if the signal dvs_sa_relax is of the level v0, the auxiliary circuit 420 may be enabled, and the auxiliary circuits 310 and 420 may jointly provide the main conduction path(s) and the additional conduction path(s) shunt between the nodes n1 and no; if the signal dvs_sa_relax is of the level v1, the auxiliary circuit 420 may be disabled, and the auxiliary circuit 310 may provide the main conduction path(s) between the nodes n1 and n0. Under the operation of the auxiliary circuits 310 and 420, the response characteristics of the node n1 (e.g., the tracking bit line discharge time) may dynamically change according to whether the signal dvs_sa_relax is of the level v0 or v1 (corresponding to different modes). Hence, when the control circuit 20 (FIG. 1a) control the operation timing of the functional circuit 40 according to the response characteristics of node n1, the operation timing may adaptively change in response to change of modes. Therefore, the functional circuit 40 may operate correctly regardless of whether the circuit module 10 stays in anyone of the modes or changes between the modes during one same operation cycle TC1 (FIG. 3c).

In the modified memory cell u[q, q'] in FIG. 4b and the memory cell c[i,i'] in FIG. 1c, the transistors d41[q,q'] and d42[q,q'] in FIG. 4b and the storage transistors a1[i,i'] and a2[i,i'] in FIG. 1c may be matched; for example, dimensions (e.g., channel lengths and/or widths, etc.) of the transistors d41[q,q'], d42[q,q'], a1[i,i'] and a2[i,i'] may be substantially equal, and doped areas for forming their channels may be formed by (on) the same semiconductor layer(s). And/or, the transistors d43[q,q'] and d44[q,q'] in FIG. 4b and the storage transistors a3[i,i'] and a4[i,i'] in FIG. 1c may be matched; for example, dimensions of the transistors d43[q,q'], d44[q,q'], a3[i,i'] and a4[i,i'] may be substantially equal, and doped areas for forming their channels may be formed by (on) the same semiconductor layer(s). And/or, the transistors gd41[q,q'] and gd42[q,q'] in FIG. 4b and the pass-gate transistors ga1[i,i'] and ga2[i,i'] in FIG. 1c may be matched; for example, dimensions of the transistors gd41[q,q'], gd42[q,q'], ga1[i,i'] and ga2[i,i'] may be substantially equal, and doped areas for forming their channels may be formed by (on) the same semiconductor layer(s). That is, the transistors in the modified memory cell u[q,q'] and the transistors in the memory cell c[i,i'] may be of same specification, same structures and same electronic characteristics. On the other hand, as shown in FIG. 1c and FIG. 4b, the interconnection between transistors in the memory cell c[i,i'] and interconnection between transistors in the modified memory cell u[q,q'] may be different; for example, in FIG. 1c, the drain terminal of the transistor a1[i,i'] may be coupled to the drain terminal of the transistor a3[i,i'], and the gate terminal of the a1[i,i'] may be insulated from the supply voltage Vcc; in FIG. 4b, the drain terminal of the transistor d41[q,q'] may be insulated from the drain terminal of the transistor d43[q,q'], and the gate terminal of the transistor d41[q,q'] may be coupled to the node n6.

Because the transistor d41[q,q'] in each modified memory cell u[q,q'] (FIG. 4b) and the transistor a1[i,i'] in each memory cell c[i,i'] (FIG. 1c) may have the same structure and characteristics, and the transistors gd41[q,q'] (FIG. 4b) and ga1[i,i'] (FIG. 1c) may also have the same structure and characteristics, when each modified memory cell u[q,q'] provides the conduction path at the node n1, effects of the conduction path on the tracking bit line TBL may reflect effects of each memory cell c[i,i'] on the bit lines BL[i'] and BL'[i'] (FIG. 1a). If the characteristics of each memory cell c[i,i'] is affected by process drifts, effects of each memory cell c[i,i'] on the bit lines BL[i'] and BL'[i'] when the word line WL[i] is driven may also be affected; however, the characteristics of each modified memory cell u[q,q'] may similarly be affected. Consequently, when the tracking word line TWL is driven, the effects of each modified memory cell u[q,q'] on the tracking bit line TBL and the response characteristics of the node n1 may reflect influence of the process drifts. Thus, when the control circuit 20 (FIG. 1a) controls the operation timing of each sensing amplifier sa[j] in the functional circuit 40 according to the response characteristics of the node n1, the operation timing and related timing parameter(s) (e.g., the memory cell read time) may adaptively reflect influence of the process drifts. As a result, each sensing amplifier sa[j] may correctly sense data stored by each corresponding memory cell c[i,i'] even if each memory cell c[i,i'] is affected by the process drifts.

Figure 5:
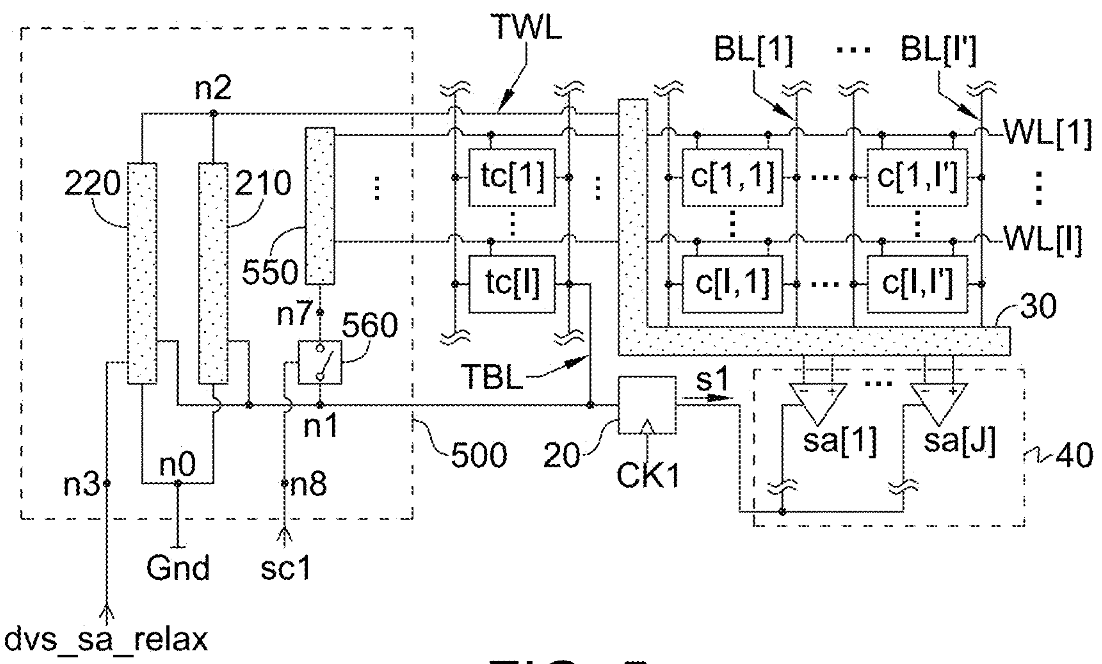
FIG. 5 depicts an auxiliary circuit set according to an embodiment of the invention, wherein the auxiliary circuit set may implement the auxiliary circuit set in FIG. 1*a*, and may include two auxiliary circuits, a tuning load and a tuning switch circuit.

FIG. 5 depicts an auxiliary circuit set 500 according to an embodiment of the invention; the auxiliary circuit set 500 may implement the auxiliary circuit set 100 in the circuit module 10 shown in FIG. 1*a*. Similar to the auxiliary circuit set 200 shown in FIG. 2, the auxiliary circuit set 500 shown in FIG. 5 may comprise the auxiliary circuits 210 and 220 described previously; in addition, as shown in FIG. 5, the auxiliary circuit 500 may further comprise a tuning load 550 and a tuning switch circuit 560. In FIG. 5, the auxiliary circuit 210 may be implemented by the auxiliary circuit 310 shown in FIG. 3*a*, and the auxiliary circuit 220 may be implemented by the auxiliary circuit 320 or 420 shown in FIG. 3*a* or FIG. 4*a*.

As shown in FIG. 5, the tuning load 550 may be coupled to a node n7. The tuning switch circuit 560 may be coupled to the tuning load 550 at the node n7, may be coupled to the tracking bit line TBL at the node n1, and may be coupled to a tuning control signal sc1 at another node n8. The tuning switch circuit 560 may control whether to electrically connect (conduct) the tuning load 550 to the node n1 according to the tuning control signal sc1. For example, in an embodiment, the tuning switch circuit 560 may electrically connect the tuning load 550 to the node n1 when the tuning control signal is logic 1, and may not electrically connect the tuning load 550 to the node n1 when the tuning control signal sc1 is logic 0. Whether the tuning load 550 is electrically connected to the node n1 may cause the response characteristics of the node n1 to change, and may therefore cause the operation timing of the functional circuit 40 to change when the control circuit 20 controls the operation timing of the functional circuit 40 according to the response characteristics of the node n1. That is, in the embodiment shown in FIG. 5 of the invention, not only the auxiliary circuits 210 and 220 may adjust the response characteristics of the node n1 and therefore the operation timing of the functional circuit 40 in response to the level of the signal dvs_sa_relax, but also the tuning switch circuit 560 may tune the response characteristics of the node n1 and therefore the operation timing of the functional circuit 40 in response to logic value of the tuning control signal sc1, so flexibility of the timing control may be increased. In other words, the tuning load 550 and the tuning switch circuit 560 may provide more options to manipulate the timing control of the invention, and may then make the timing control of the invention more flexible and diverse.

Figure 6A:
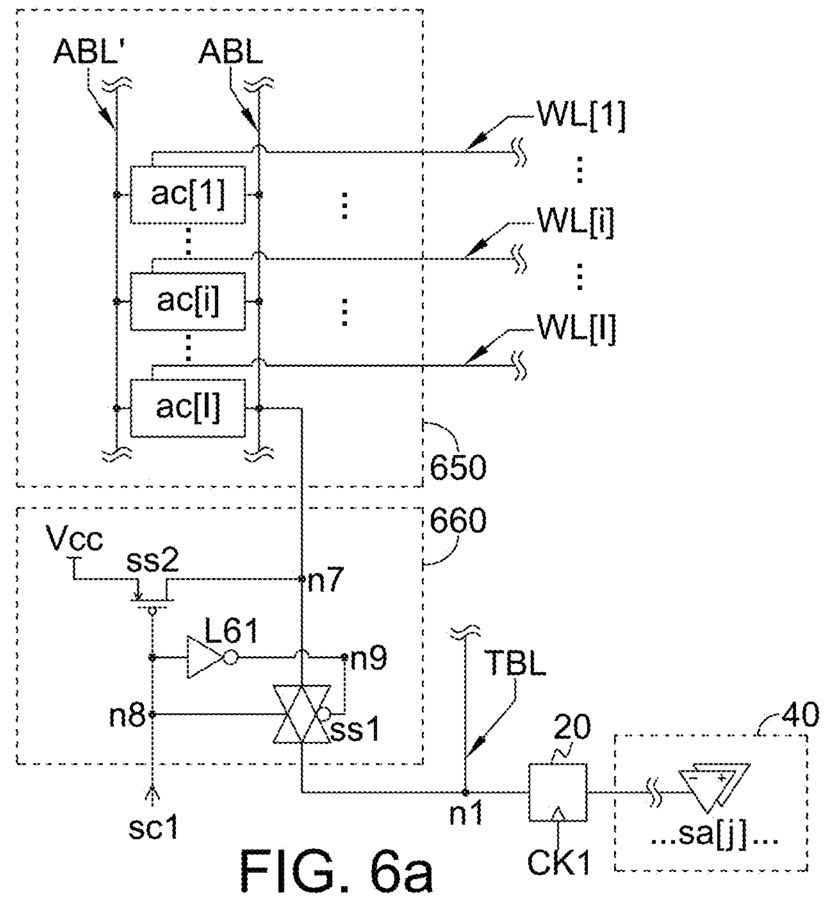
FIG. 6*a* depicts a tuning load and a tuning switch circuit according to an embodiment of the invention, wherein the tuning load and the tuning switch circuit may respectively implement the tuning load and the tuning switch circuit in FIG. 5, and the tuning load may include one or more additional memory cells.

FIG. 6*a* depicts a tuning load 650 and a tuning switch circuit 660 according to an embodiment of the invention; the tuning load 650 and the tuning switch circuit 660 shown in FIG. 6*a* may respectively implement the tuning load 550 and the tuning switch circuit 560 shown in FIG. 5. As shown in FIG. 6*a*, the tuning load 650 may comprise a set of additional bit lines ABL and ABL', and number I of additional memory cells ac[1] to ac[I]. The additional bit line ABL may be coupled to the node n7. Each additional memory cell ac[i], for index i=1 to I, may be coupled to the word line WL[i] and the additional bit lines ABL and ABL'. The tuning switch circuit 660 may comprise an inverter L61, a main switch ss1 and an additional switch ss2. The inverter L61 may comprise an input terminal and an output terminal respectively coupled to the node n8 (the tuning control signal sc1) and another node n9. The main switch ss1 may be a transmission gate comprising two connection terminals and two main switch control terminals respectively coupled to the nodes n1, n7, n8 and n9. The additional switch ss2 may be a p-channel MOS transistor comprising a controlled terminal and two channel terminals (e.g., a gate terminal, a drain terminal and a source terminal) respectively coupled to the node n8, the node n7 and the supply voltage Vcc.

When the logic value of the tuning control signal sc1 at the node n8 is logic 1, the main switch ss1 may electrically connect (conduct) the node n7 (the additional bit line ABL) to the node n1, so the tuning load 650 may be electrically connected to the node n1; the additional switch ss2 may not electrically connect the node n7 to the supply voltage Vcc. When the logic value of the tuning control signal sc1 is logic 0, the main switch ss1 may not electrically connect the node n7 to the node n1, so the tuning load 650 may not be electrically connected to the node n1; the additional switch ss2 may electrically connect the node n7 to the supply voltage Vcc, and the tuning load 650 may therefore be electrically connected to the supply voltage Vcc.

Figure 6B:
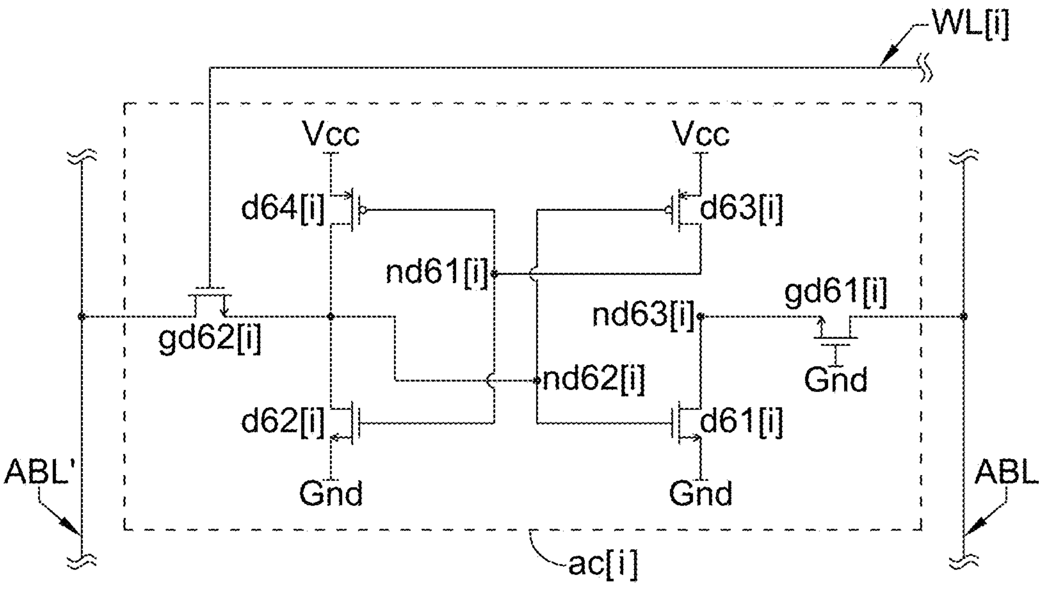
FIG. 6*b* depicts an embodiment of the additional memory cell in FIG. 6*a;*

FIG. 6*b* depicts an embodiment of each additional memory cell ac[i] shown in FIG. 6*a*. As shown in FIG. 6*b*, the additional memory cell ac[i] may comprise transistors gd61[*i*] and gd62[*i*], and transistors d61[*i*] to d64[*i*]. The transistors gd61[*i*], gd62[*i*], d61[*i*] and d62[*i*] may be n-channel MOS transistors, and the transistors d63[*i*] and d64[*i*] may be p-channel MOS transistors. The transistor gd61[*i*] may comprise a controlled terminal and two channel terminals (e.g., a gate terminal, a drain terminal and a source terminal) respectively coupled to the ground voltage Gnd, the additional bit line ABL and a node nd63[*i*]. The transistor gd62[*i*] may comprise a controlled terminal and two channel terminals respectively coupled to the word line WL[i], the additional bit line ABL' and a node nd62[*i*]. The transistor d61[*i*] may comprise a controlled terminal and two channel terminals (e.g., a gate terminal, a drain terminal and a source terminal) respectively coupled to the nodes nd62[*i*], nd63[*i*] and the ground voltage Gnd. The transistor d62[*i*] may comprise a controlled terminal and two channel terminals respectively coupled to a node nd61[*i*], the node nd62[*i*] and the ground voltage Gnd. The transistor d63[*i*] may comprise a controlled terminal and two channel terminals (e.g., a gate terminal, a drain terminal and a source terminal) respectively coupled to the nodes nd62[*i*], nd61[*i*] and the supply voltage Vcc. The transistor d64[*i*] may comprise a controlled terminal and two channel terminals respectively coupled to the nodes nd61[*i*], nd62[*i*] and the supply voltage Vcc. When the word line WL[i] is driven, the gate transistor gd62[*i*] may electrically connect (conduct) the node n62 [i] to the additional bit line ABL'. When the word line WL[i] is not driven, the gate transistor gd62[*i*] may not electrically connect the node n62 [i] to the additional bit line ABL'.

In the additional memory cell ac[i] shown in FIG. 6*b* and the memory cell c[i,i'] shown in FIG. 1*c*, the transistors d61[*i*] and d62[*i*] in FIG. 6*b* and the storage transistors a1[*i,i*'] and a2[*i,i*'] in FIG. 1*c* may be matched; for example, dimensions (e.g., channel lengths and/or widths, etc.) of the transistors d61[*i*], d62[*i*], a1[*i,i*'] and a2[*i,i*'] may be substantially equal, and doped areas for forming their channels may be formed by (on) the same semiconductor layer(s). And/or, the transistors d63[*i*] and d64[*i*] in FIG. 6*b* and the storage transistors a3[*i,i*'] and a4[*i,i*'] in FIG. 1*c* may be matched; for example, dimensions of the transistors d63[*i*], d64[*i*], a3[*i,i*'] and a4[*i,i*'] may be substantially equal, and doped areas for forming their channels may be formed by (on) the same semiconductor layer(s). And/or, the transistors gd61[*i*] and gd62[*i*] in FIG. 6*b* and the pass-gate transistors ga1[*i,i*'] and ga2[*i,i*'] in FIG. 1*c* may be matched; for example, dimensions of the transistors gd61[*i*], gd62[*i*], ga1[*i,i*'] and ga2[*i,i*'] may be substantially equal, and doped areas for forming their channels may be formed by (on) the same semiconductor layer(s). Because of such transistor match arrangement, when the tuning switch circuit 660 electrically connect the node n7 to the node n1, equivalent load of the additional bit line ABL at the node n1 may reflect equivalent load of the bit lines BL[i'] and BL'[i'] seen by the sensing amplifier sa[j].

Figure 6C:
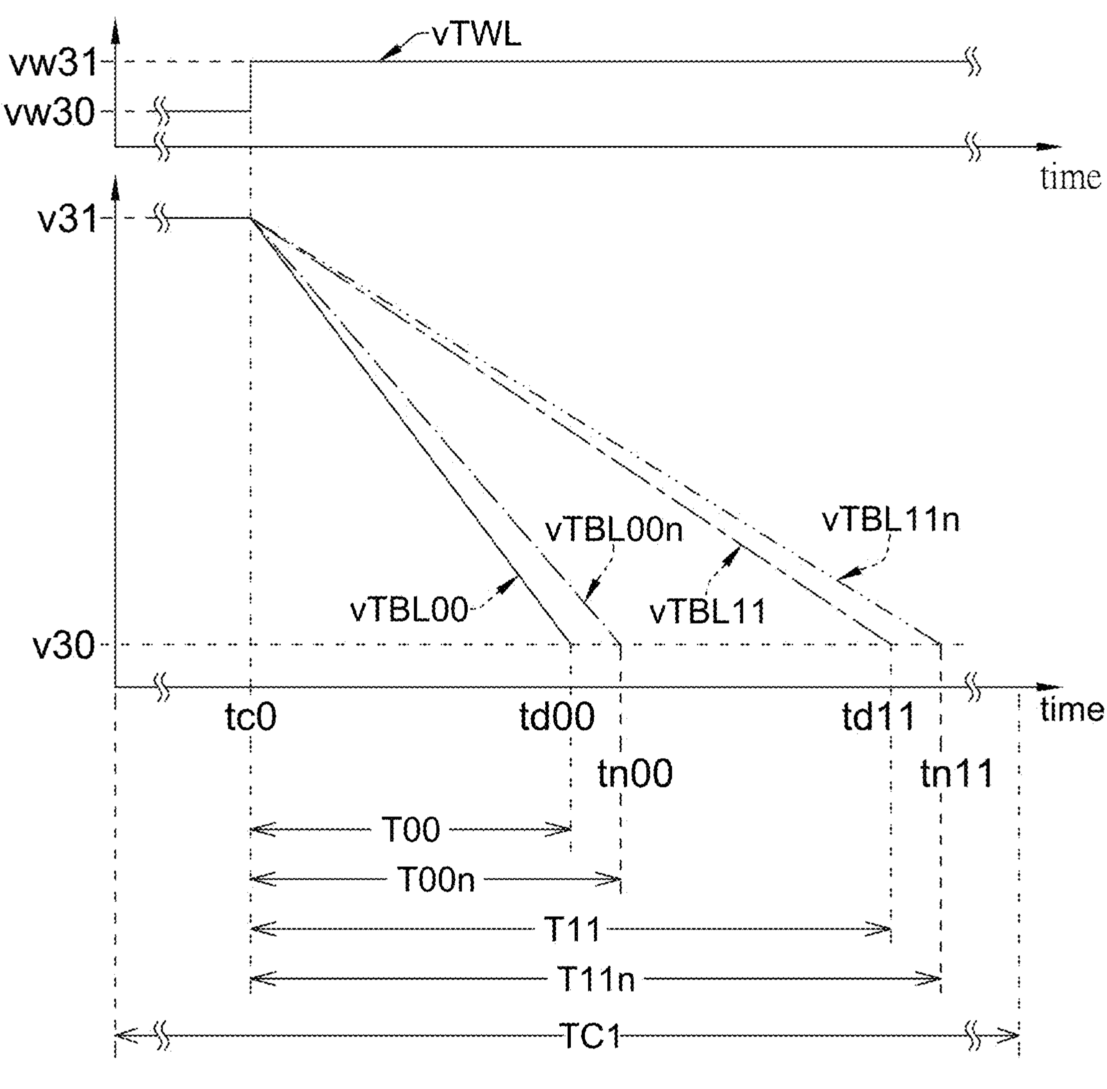
FIG. 6*c* depicts waveform and timing embodiments of related signals in FIG. 6*a* under different scenarios.

FIG. 6*c* depicts waveform and timing embodiments of related signals in FIG. 6*a*; the waveform vTWL may represent the voltage of the tracking word line TWL, while the waveforms vTBL00, vTBL11 and a waveform vTBL11*n* may represent voltage responses of the tracking bit line TBL respectively in various scenarios. As shown in FIG. 6*c*, after the operation cycle TC1 of the circuit module 10 starts, the voltage of the tracking word line TWL may be driven from the levels vw30 to vw31 at the time point tc0, as previously described by referring to FIG. 3*c*. After the time point tc0, as the tracking word line TWL is driven, the voltage of the tracking bit line TBL at the node n1 may start to change (e.g., decrease).

As demonstrated by the waveform vTBL00 in FIG. 6*c*, when the tracking word line TWL is driven since the time point tc0, if the signal dvs_sa_relax (FIG. 1*b*) remains to stay at the level v0 and the tuning control signal sc1 (FIG. 6*a*) causes the tuning switch circuit 660 not to electrically connect the tuning load 650 to the node n1, then the tracking bit line TBL coupled to the node n1 may start to discharge to the node no via the enabled auxiliary circuits 210 and 220 (FIG. 5) from the level v31 at the time point tc0, and may change to the level v30 at the time point td00, like the first scenario previously described by referring to FIG. 3*c*. In this first scenario, the tracking bit line discharge time may be the time value T00 (from the time points tc0 to td00).

As demonstrated by the waveform vTBL11 in FIG. 6*c*, when the tracking word line TWL is driven since the time point tc0, if the signal dvs_sa_relax (FIG. 1*b*) remains the level v1 and the tuning control signal sc1 (FIG. 6*a*) causes the tuning switch circuit 660 not to electrically connect the tuning load 650 to the node n1, then the tracking bit line TBL coupled to the node n1 may start to discharge to the node no via the enabled auxiliary circuit 210 from the level v31 at the time point tc0, and may change to the level v30 at the time point td11, like the fourth scenario previously described by referring to FIG. 3*c*. In this fourth scenario, the tracking bit line discharge time may be the time value T11 (from the time points tc0 to td11).

In a fifth scenario, the signal dvs_sa_relax may remain at the level v0 after the time point tc0, and the tuning control signal sc1 may cause the tuning switch circuit 660 to electrically connect the tuning load 650 to the node n1; thus, when the tracking word line TWL is driven since the time point tc0, the tracking bit line TBL coupled to the node n1 and the tuning load 650 may start to discharge to the node no via the enabled auxiliary circuits 210 and 220 from the level v31 at the time point tc0, and may change to the level v30 at a time point tn00, as demonstrated by the waveform vTBL00*n* in FIG. 6*c*. In this fifth scenario, the tracking bit line discharge time may be a time value T00*n* (from the time points tc0 to tn00).

In a sixth scenario, the signal dvs_sa_relax may remain at the level v1 after the time point tc0, and the tuning control signal sc1 may cause the tuning switch circuit 660 to electrically connect the tuning load 650 to the node n1; thus, when the tracking word line TWL is driven since the time point tc0, the tracking bit line TBL coupled to the node n1 and the tuning load 650 may start to discharge to the node no via the enabled auxiliary circuit 210 from the level v31 at the time point tc0, and may change to the level v30 at a time point tn11, as demonstrated by the waveform vTBL11*n* in FIG. 6*c*. In this sixth scenario, the tracking bit line discharge time may be a time value T11*n* (from the time points tc0 to tn11).

When the tuning control signal sc1 causes the tuning switch circuit 660 not to electrically connect the tuning load 650 to the node n1, if the signal dvs_sa_relax changes from the levels v0 to v1 or v1 to v0 after the time point tc0 during the same operation cycle TC1, then the voltage response waveform of the tracking bit line TBL may be enveloped between the waveforms vTBL00 and vTBL11, and the tracking bit line discharge time may be between the time values T00 and T11, as previously explained by referring to FIG. 3*c*. Similarly, as shown in FIG. 6*c*, when the tuning control signal sc1 causes the tuning switch circuit 660 to electrically connect the tuning load 650 to the node n1, if the signal dvs_sa_relax changes from the levels v0 to v1 or v1 to v0 after the time point tc0 during the same operation cycle TC1, then the voltage response waveform of the tracking bit line TBL may be enveloped between the waveforms vTBL00*n* and vTBL11*n*, and the tracking bit line discharge time may be between the time values T00*n* and T11*n*.

In other words, as shown in FIG. 6*c*, for the response parameter(s) related to the response characteristics of the node n1, selecting whether to electrically connect the tuning load 650 to the node n1 may change the corresponding response parameter range(s) of the response parameter(s). Since the control circuit 20 (FIG. 5) may control the operation timing of the functional circuit 40 according to the response characteristics of the node n1, for the timing parameter(s) (e.g., the memory cell read time) related to the operation timing, selecting whether to electrically connect the tuning load 650 to the node n1 may also change the corresponding timing parameter range(s) of the timing parameter(s). It is then understood that, by the operation arrangement of the tuning load 650 and the tuning switch circuit 660, the invention may expand diversity of timing control, may provide more options to manipulate timing, and may therefore meet more needs of timing control, e.g., the needs to overcome process drifts.

Besides, in the scenarios that the tuning control signal sc1 causes the tuning switch 660 to electrically connect the tuning load 650 to the node n1, the response parameter(s) (e.g., the tracking bit line discharge time) related to the response characteristics of the node n1 (the tracking bit line TBL) may have definite and predictable response parameter range(s) (e.g., between the time values T00*n* and T11*n*) regardless of whether the signal dvs_sa_relax stays at the level v0, stays at the level v1, changes from the levels v0 to v1 or changes from the levels v1 to v0 during the same operation cycle TC1. Thus, when the control circuit 20 (FIG. 5) controls the operation timing of the functional circuit 40 according to the response characteristics of the node n1, the timing parameter(s) (e.g., the memory cell read time) related to the operation timing may also have definite timing parameter range(s).

Moreover, in the additional memory cell ac[i] in FIG. 6*b* and the memory cell c[i,i'] in FIG. 1*c*, the transistors d61[*i*] and d62[*i*] in FIG. 6*b* and the transistors a1[*i,i*'] and a2[*i,i*'] may have the same structure and characteristics, the transistors d63[*i*] and d64[*i*] in FIG. 6*b* and the transistors a3[*i,i*'] and a4[*i,i*'] in FIG. 1*c* may have the same structure and characteristics, and the transistors gd61[*i*] and gd62[*i*] in FIG. 6*b* and the transistors ga1[*i,i'*] and ga2[*i,i'*] in FIG. 1*c* may have the same structure and characteristics.

Thus, when the tuning switch circuit 660 (FIG. 6*a*) electrically connects the additional bit line ABL, which is coupled to the node n7, to the node n1, effects of the additional bit line ABL acting on the node n1 may reflect effects of the bit lines BL[i'] and BL'[i'] acting on the sensing amplifier sa[j]. If the characteristics of each memory cell c[i,i'] is affected by process drifts, the effects of the bit lines BL[i'] and BL'[i'] acting on the sensing amplifier sa[j] may also be affected; however, effects of each additional memory cell ac[i'] acting on the additional bit line ABL may similarly reflect influences of the process drifts. Thus, in the scenarios that the tuning switch circuit 660 electrically connects the additional bit line ABL to the node n1, when the control circuit 20 (FIG. 5) controls the operation timing of each sensing amplifier sa[j] in the functional circuit 40 according to the response characteristics of the node n1, the operation timing and the related timing parameter(s) (e.g., the memory cell read time) may adaptively reflect influence of the process drifts. As a result, each sensing amplifier sa[j] may correctly sense data stored by each corresponding memory cell c[i,i'] even if each memory cell c[i,i'] is affected by the process drifts.

Figure 7A:
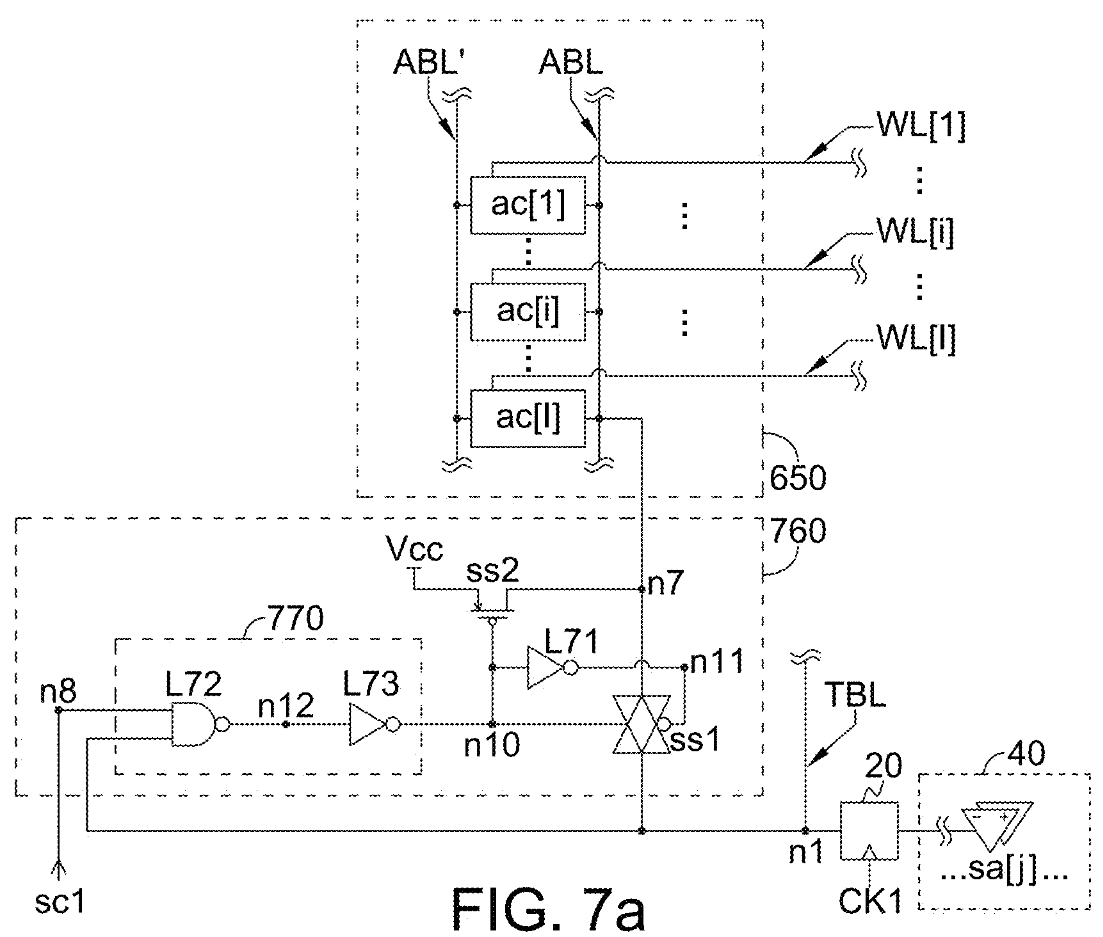
FIG. 7*a* depicts a tuning load and a tuning switch circuit according to an embodiment of the invention, wherein the tuning load and the tuning switch circuit may respectively implement the tuning load and the tuning switch circuit in FIG. 5.
Figure 7B:
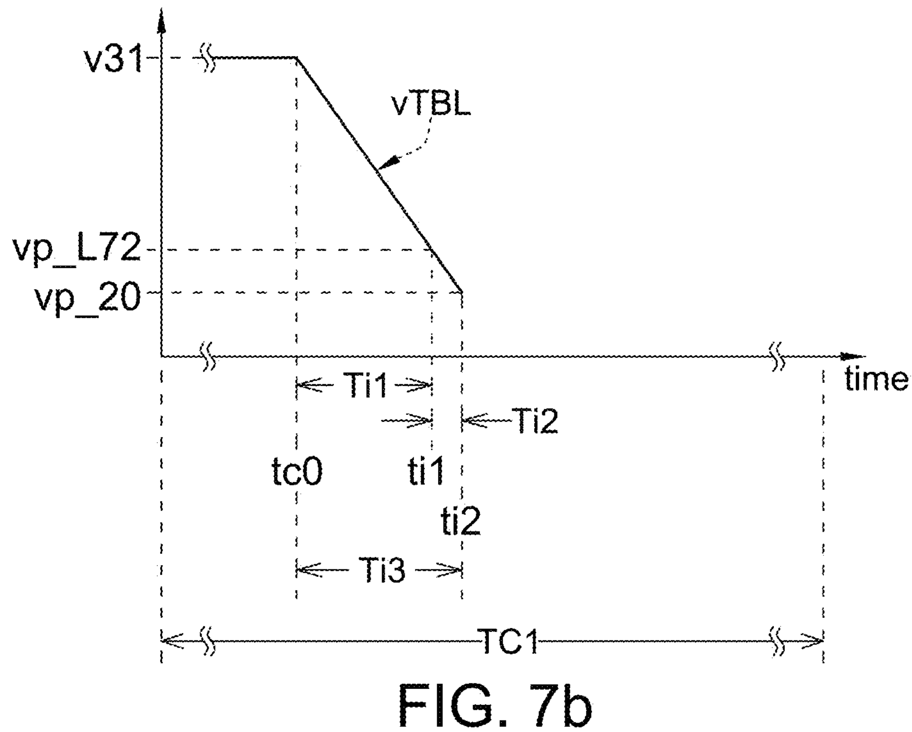
FIG. 7*b* depicts operation of the tuning switch circuit in FIG. 7*a;*

FIG. 7*a* depicts a tuning switch circuit 760 according to an embodiment of the invention, and FIG. 7*b* depicts waveform and timing embodiments of related signals when the tuning switch circuit 760 operates. The tuning switch circuit 760 in FIG. 7*a* and the tuning load 650 in FIG. 6*a* (also reproduced in FIG. 7*a*) may cooperate to respectively implement the tuning switch circuit 560 and the tuning load 550 in FIG. 5. As shown in FIG. 7*a*, the tuning switch circuit 760 may comprise an inverter L71, a main switch ss1, an additional switch ss2 and a tuning logic circuit 770. The inverter L71 may comprise an input terminal and an output terminal respectively coupled to two nodes n10 and n11. The main switch ss1 may be a transmission gate, and may comprise two connection terminals and two main switch control terminals respectively coupled to the nodes n1, n7, n10 and n11. The additional switch ss2 may be a p-channel MOS transistor, and may comprise a controlled terminal and two channel terminals (e.g., a gate terminal, a drain terminal and a source terminal) respectively coupled to the node n10, the node n7 and the supply voltage Vcc. When a logic value of the node n10 is logic 1, the main switch ss1 may conduct (electrically connect) the node n7 to the node n1 for conducting the tuning load 650 to the node n1; the additional switch ss2 may not conduct the node n7 to the supply voltage Vcc. When the logic value of the node n10 is logic 0, the main switch ss1 may not conduct the node n7 to the node n1, so the tuning load 650 may no longer be conducted to the node n1; the additional switch ss2 may conduct the node n7 to the supply voltage Vcc, so the tuning load 650 may be conducted to the supply voltage Vcc.

The tuning logic circuit 770 may comprise a first logic input terminal, a second logic input terminal and a logic output terminal respectively coupled to the node n1 (the tracking bit line TBL), the node n8 (the tuning control signal sc1) and the node n10. As shown in FIG. 7*a*, in an embodiment of the invention, the tuning logic circuit 770 may comprise a logic gate L72 (e.g., a two-input NAND gate) and an inverter L73; the logic gate L72 may comprise two input terminals and one output terminal respectively coupled to the node n1, the node n8 and a node n12, and the inverter L73 may comprise an input terminal and an output terminal respectively coupled to the nodes n12 and n10. The two input terminals of the logic gate L72 at the nodes n1 and n8 and the output terminal of the inverter L73 at the node n10 may respectively form the first logic input terminal, the second logic input terminal and the logic output terminal of the tuning logic circuit 770. The logic gate L72 in the tuning logic circuit 770 may determine whether a logic value of the node n1 is logic 1 or logic 0 according to whether the voltage at the node n1 is higher than a tuning logic trip point level vp_L72 (FIG. 7*b*). On the other hand, the control circuit 20 may determine whether the logic value of the node n1 is logic 1 or logic 0 according to whether the voltage at the node n1 is higher than a control logic trip point level vp_20 (FIG. 7*b*), and may control the operation timing of each sensing amplifier sa[j] in the functional circuit 40 according to the logic value of the node n1.

When the tuning control signal sc1 at the node n8 is logic 1, if the tuning logic circuit 770 determines that the logic value of the node n1 is logic 1, the tuning logic circuit 770 may output logic 1 at the node n10, thus the tuning switch circuit 760 may conduct the tuning load 650 to the node n1. When the tuning control signal sc1 at the node n8 is logic 1, if the tuning logic circuit 770 determines that the logic value of the node n1 is logic 0, the tuning logic circuit 770 may output logic 0 at the node n10, thus the tuning switch circuit 760 may not conduct the tuning load 650 to the node n1. When the tuning control signal sc1 at the node n8 is logic 0, the tuning logic circuit 770 may output logic 0 at the node n10, so the tuning switch circuit 760 may not conduct the tuning load 650 to the node n1, regardless of the logic value of the node n1.

In FIG. 7*b*, a waveform vTBL may demonstrate the voltage response of the tracking bit line TBL (the node n1). As previously mentioned by referring FIG. 3*c* and FIG. 6*c*, during an operation cycle TC1, when the tracking word line TWL is driven at the time point tc0, the tracking bit line TBL may start to discharge from the level v31, as shown by the waveform vTBL in FIG. 7*b*. In an embodiment of the invention, the tuning logic trip point level vp_L72 for the tuning logic circuit 770 to determine whether the voltage at the node n1 is logic 1 or logic 0 may be different from the control logic trip point level vp_20 for the control circuit 20 to determine whether the voltage at the node n1 is logic 1 or logic 0; for example, as shown in FIG. 7*b*, the tuning logic trip point level vp_L72 may be higher than the control logic trip point level vp_20. Thus, when the tracking bit line TBL discharges to the tuning logic trip point vp_L72 at a time point ti1, the logic gate L72 in the tuning logic circuit 770 may determine that the logic value of the node n1 changes from logic 1 to logic 0, while the control circuit 20 (FIG. 7*a*) may still determine that the logic value of the node n1 is logic 1. Based on the operation of the logic gate L72, no matter whether the tuning control signal sc1 at the node n8 is logic 0 or logic 1, the tuning logic circuit 770 may cause the logic value of the node n10 to be logic 0 after the time point ti1; thus, after the time point ti1, the tuning switch circuit 760 may not conduct the tuning load 650 to the node n1.

After the time point ti1, because the control circuit 20 may still determine that the logic value of the node n1 is logic 1, the tracking bit line TBL (the node n1) may keep on discharging, and may discharge to the control logic trip point level vp_20 at a later time point ti2. Thus, at the time point ti2, the control circuit 20 may determine that the logic value of the node n1 changes from logic 1 to logic 0, and may control the operation timing of the functional circuit 40 according to the change of the logic value. As shown in FIG. 7*b*, in an embodiment of the invention, the tuning logic trip point level vp_L72 may be lower than the level v31, and may be between the level v31 and the control logic trip point level vp_20. In an embodiment, the control logic trip point level vp_20 may substantially equal the level v30 in FIG. 3c and FIG. 6c.

From the previous disclosure, it is understood that, if the tuning control signal sc1 remains to be logic 1 during the operation cycle TC1, the tuning switch circuit 760 may conduct the tuning load 650 to the node n1 before the time point ti1, but may stop conducting the tuning load 650 to the node n1 after the time point ti1. That is, even though the tuning control signal sc1 remains to be logic 1, the tuning switch circuit 760, which may originally conduct the tuning load 650 to the node n1, may stop conducting the tuning load 650 to the node n1 when discharge of the tracking bit line TBL approaches the control logic trip point level vp_20 (enters a range between the tuning logic trip point level vp_L72 and the control logic trip point level vp_20) but does not reach the control logic trip point level vp_20. Under such operation arrangement, when the tracking bit line TBL (the node n1) is going to discharge to the control logic trip point level vp_20, electrical charges accumulated by pre-charge at the additional bit line ABL (the node n7) may not interfere discharge of the tracking bit line TBL (the node n1) via conduction of the tuning switch circuit 760. On the other hand, if the tuning control signal sc1 remains to be logic 0 during the operation cycle TC1, the tuning switch circuit 760 may remain not to conduct the tuning load 650 to the node n1.

In FIG. 7b, the control logic trip point level vp_20 may be referred to as a reference level, the tuning logic trip point level vp_L72 may be referred to as a middle level. When the control circuit 20 controls the operation timing of the functional circuit 40 according to the response characteristics of the node n1 (the tracking bit line TBL), the response characteristics of the node n1 may relate to an interval Ti3 (from the time points tc0 to ti2) for the voltage at the node n1 to change from the level v31 to the reference level vp_20. From FIG. 7a and FIG. 7b, it is understood that, during an interval Ti1 (from the time points tc0 to ti1) when the voltage at the node n1 changes from the initial level v31 to the middle level vp_L72, the tuning switch circuit 760 may control whether to conduct the tuning load 650 to the node n1 according to whether the tuning control signal sc1 is logic 1. During an interval Ti2 (from the time points ti1 to ti2) when the voltage at the node n1 changes from the middle level vp_L72 to the reference level vp_20, the tuning switch circuit 760 may not conduct the tuning load 650 to the node n1, regardless of whether the tuning control signal sc1 is logic 1.

Figure 8A:
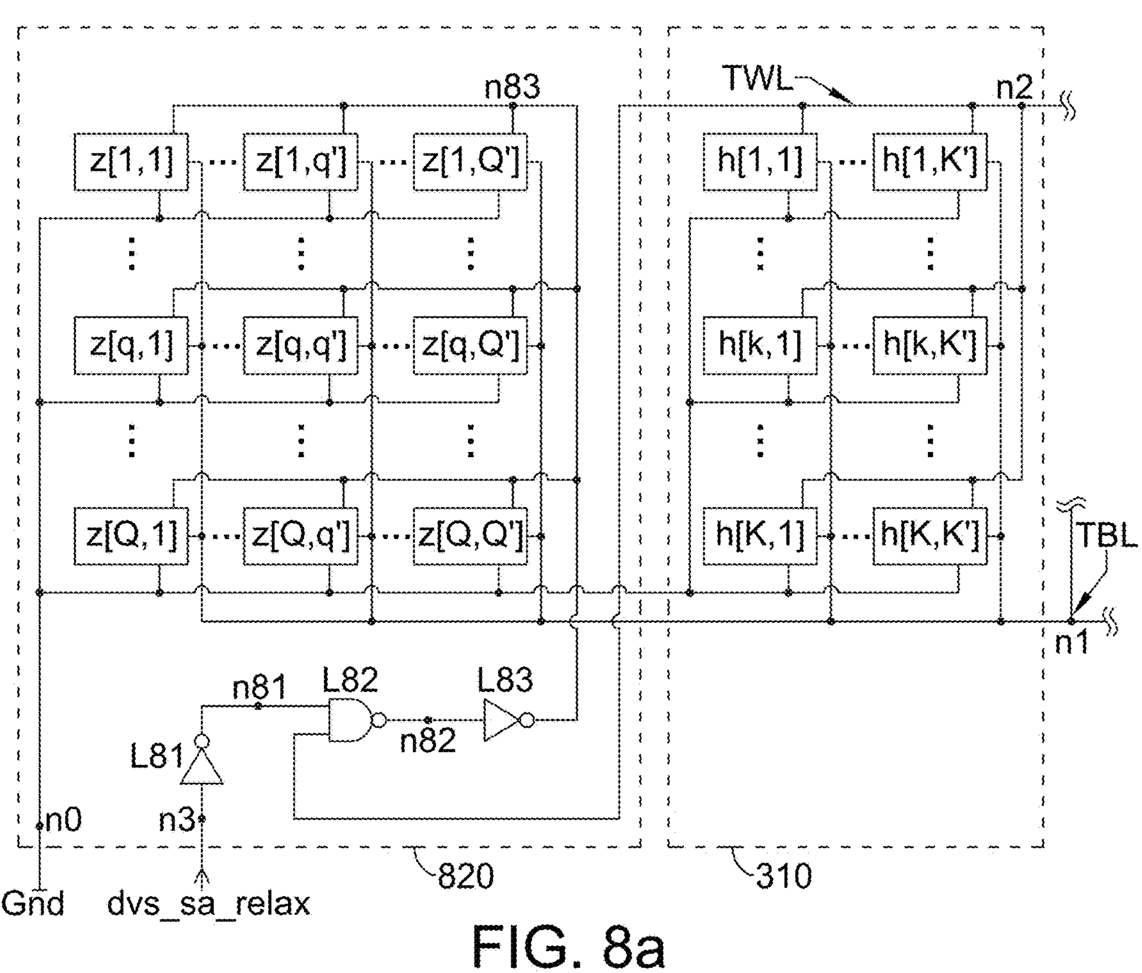
FIG. 8*a* depicts two auxiliary circuits according to an embodiment of the invention, wherein the two auxiliary circuits may respectively implement the two auxiliary circuits in FIG. 2 or FIG. 5, and may include one or more modified memory cells.

FIG. 8a depicts an auxiliary circuit 820 according to an embodiment of the invention; the auxiliary circuit 820 and the auxiliary circuit 310 in FIG. 3a (also reproduced in FIG. 8a) may cooperate to respectively implement the auxiliary circuits 220 and 210 in FIG. 2 or FIG. 5. As shown in FIG. 8a, the auxiliary circuit 820 may comprise number Q*Q' modified memory cell(s) z[1,1] to z[Q,Q], two inverters L81 and L83, and a two-input NAND gate L82. Each modified memory cell z[q, q'] (for indices q=1 to Q and q'=1 to Q') may be coupled to the node n1 (the tracking bit line TBL), the node n0 (the ground voltage Gnd) and another node n83. The inverter L81 may comprise an input terminal and an output terminal respectively coupled to the node n3 (the signal dvs_sa_relax) and another node n81. The NAND gate L82 may comprise two input terminals and one output terminal respectively coupled to the node n81, the node n2 (the tracking word line TWL) and another node n82. The inverter L83 may comprise an input terminal and an output terminal respectively coupled to the nodes n82 and n83.

Figure 8B:
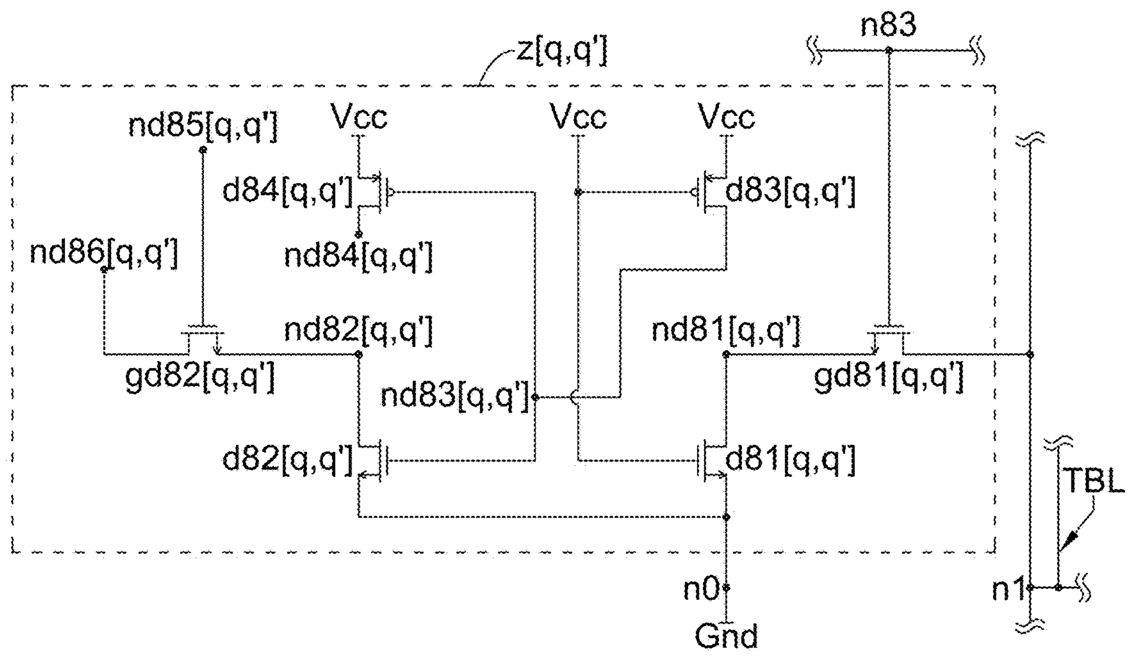
FIG. 8*b* depicts an embodiment of the modified memory cell in FIG. 8*a*.

FIG. 8b depicts an embodiment of each modified memory cell z[q, q'] in FIG. 8a. The modified memory cell z[q,q'] may comprise transistors gd81[q,q'] and gd82[q,q'], and transistors d81[q,q'] to d84[q,q']. The transistors gd81[q,q'], gd82[q,q'], d81[q,q'] and d82 [q,q'] may be n-channel MOS transistors, and the transistors d83 [q, q'] and d84[q,q'] may be p-channel MOS transistors. The transistor gd81[q,q'] may comprise a controlled terminal and two channel terminals (e.g., a gate terminal, a drain terminal and a source terminal) respectively coupled to the node n83, the node n1 (the tracking bit line TBL) and another node nd81[q,q']. The transistor gd82[q,q'] may comprise a controlled terminal and two channel terminals respectively coupled to three nodes nd85[q,q'], nd86[q,q'] and nd82 [q, q']. The transistor d81 [q,q'] may comprise a controlled terminal and two channel terminals (e.g., a gate terminal, a drain terminal and a source terminal) respectively coupled to the supply voltage Vcc, the node nd81[q,q'] and the node n0 (the ground voltage Gnd). The transistor d82 [q, q'] may comprise a controlled terminal and two channel terminals respectively coupled to a node nd83 [q, q'], the node nd82 [q,q'] and the node n0. The transistor d83 [q,q'] may comprise a controlled terminal and two channel terminals (e.g., a gate terminal, a drain terminal and a source terminal) respectively coupled to the supply voltage Vcc, the node nd83 [q, q'] and the supply voltage Vcc. The transistor d84[q,q'] may comprise a controlled terminal and two channel terminals respectively coupled to the node nd83 [q,q'], another node nd84[q,q'] and the supply voltage Vcc. The nodes nd81[q,q'] to nd84[q,q'] may be mutually insulated. In an embodiment, the number I (FIG. 1) and the number Q (FIG. 8q) may be equal, and the node nd85[q,q'] may be coupled to the word line WL[q], for index q=1 to Q. In an embodiment, the node nd86[q,q'] may be float.

In the modified memory cell z[q,q'], when the tracking word line TWL (FIG. 8a) is driven, if the signal dvs_sa_relax is of the level v0, then the transistors gd81[q,q'] and d81[q,q'] may be turned on, and may provide a conduction path between the nodes n1 and no. Contrarily, when the tracking word line TWL is driven, if the signal dvs_sa_relax is of the level v1, the transistor gd81[q,q'] may be off, and the modified memory cell z[q, q'] may not provide the conduction path between the nodes n1 and no. When the tracking word line TWL is not driven, the transistor gd81 [q,q'] may be off, and the modified memory cell z[q, q'] may not provide the conduction path between the nodes n1 and no.

Based on the operation of each modified memory cell z[q, q'], when the tracking word line TWL is driven, if the signal dvs_sa_relax is of the level v0, the auxiliary circuit 820 (FIG. 8a) may be enabled, and the modified memory cell(s) z[1,1] to z[Q, Q'] may provide Q*Q' conduction path(s) shunt between the nodes n1 and no as additional conduction path(s). When the tracking word line TWL is driven, if the signal dvs_sa_relax is of the level v1, the auxiliary circuit 820 may be disabled, and may not provide the Q*Q' conduction path(s) between the nodes n1 and no. When the tracking word line TWL is not driven, the auxiliary circuit 820 may also be disabled. In other words, the auxiliary circuit 820 in FIG. 8a and the auxiliary circuit 320 in FIG. 3a may have the same functionality.

Figure 9:
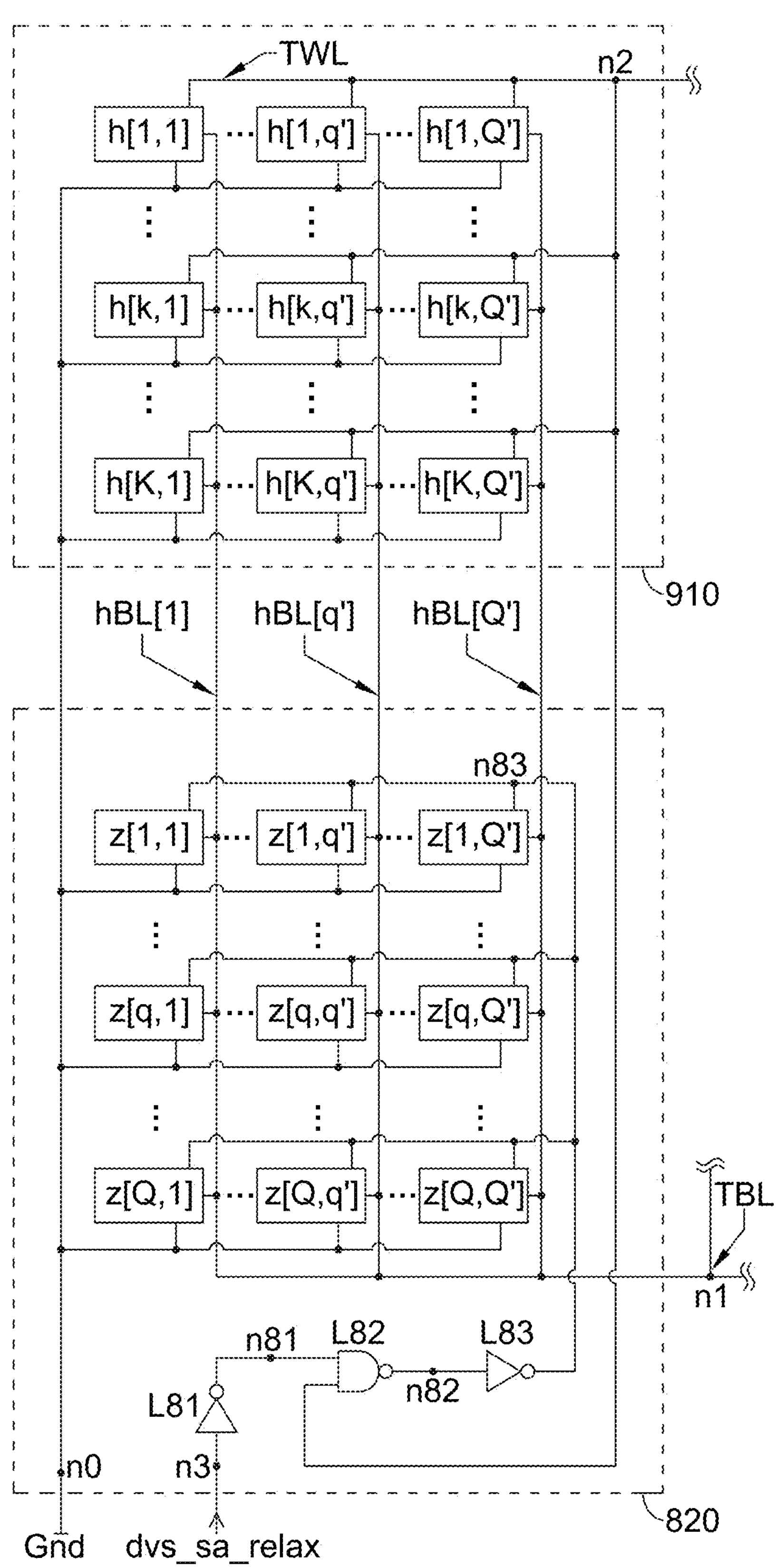
FIG. 9 depicts two auxiliary circuits according to an embodiment of the invention, wherein the two auxiliary circuits may respectively implement the two auxiliary circuits in FIG. 2 or FIG. 5.

FIG. 9 depicts an auxiliary circuit 910 according to an embodiment of the invention; the auxiliary circuit 910 and the auxiliary circuit 820 in FIG. 8a (also reproduced in FIG. 9) may cooperate to respectively implement the auxiliary circuits 210 and 220 in FIG. 2 or FIG. 5. The auxiliary circuit 910 may comprise number K*Q' modified memory cell(s) h[1,1] to h[K,Q'], each modified memory cell h[k, q'] (for indices k=1 to K and q'=1 to Q') may be coupled to the node n1 (the tracking bit line TBL), the node n2 (the tracking word line TWL) and the node n0 (the ground voltage Gnd). The modified memory cell(s) h[1,q'] to h[K,q'] in the auxiliary circuit 910 and the modified memory cell(s) z[1,q'] to z[Q,q'] may be coupled to the node n1 via a same line hBL[q'], for index q'=1 to Q'. The modified memory cell h[k, q'] in FIG. 9 may be implemented by the modified memory cell h[k,k'] in FIG. 3*b* (with index k' in FIG. 3*b* replaced by index q'). In an embodiment, a summed number K+Q of the numbers K and Q may equal the number I in FIG. 1*a*, and the node nd35[*k,k'*] in FIG. 3*b* may be coupled to the word line WL[k] (FIG. 1*a*), for index k=1 to K, when implementing the modified memory cell h[k, q'] in FIG. 9 by the modified memory cell h[k,k'] in FIG. 3*b*. In the auxiliary circuit 820 shown in FIG. 9, the node nd85[*q,q'*] (FIG. 8*b*) of each modified memory cell z[q, q'] may be coupled to the word line WL[K+q], for index q=1 to Q.

To sum up, the invention may equip a circuit module (e.g., 10 in FIG. 1*a*) with an auxiliary circuit set (e.g., 100, 200 or 500 in FIG. 1*a*, FIG. 2 or FIG. 5), which may comprise two auxiliary circuits (e.g., 210 and 220 in FIG. 2 or FIGS. 5, 310 and 320 in FIGS. 3*a*, 310 and 420 in FIGS. 4*a*, 310 and 820 in FIG. 8*a*, or 910 and 820 in FIG. 9) respectively as a main auxiliary circuit and an additional auxiliary circuit, both being coupled to a first node (e.g., n1). The circuit module may operate in different modes (of different, e.g., supply voltages and/or clock periods), and may receive one or more mode signals (e.g., dvs_sa_relax), with different levels of each mode signal relating to different modes. In the circuit module, as a control circuit (e.g., 20) controls operation timing of a functional circuit (e.g., 40) according to response characteristics of the first node, the main auxiliary circuit may remain enabled to provide main conduction path(s) at the first node, and the additional auxiliary circuit may be enabled or disabled in response to whether the mode signal is of a second level or a first level, and may therefore provide or not provide additional conduction path(s) at the first node. Based on operation arrangement of the main auxiliary circuit and the additional auxiliary circuit, the invention may definitely and reliably determine variation range(s) and corresponding margin(s) of timing parameter(s) (e.g., memory cell read time), and the circuit module according to the invention may continue normal operation of an operation cycle even if the mode switches during the operation cycle. Besides, the circuit module according to the invention may further comprise a tuning load and a tuning switch circuit (e.g., 550 and 560 in FIGS. 5, 650 and 660 in FIG. 6*a*, or 650 and 760 in FIG. 7*a*); the tuning switch circuit may control whether to conduct the tuning load to the first node according to a tuning control signal (e.g., sc1 in FIG. 5, FIG. 6*a* and FIG. 7*a*), and may therefore enrich options and flexibility of the timing control. And, the circuit module according to the invention may further comprise one or more memory cells with each memory cell (e.g., c[i,i'] in FIG. 1*a* and FIG. 1*c*) storing data of one bit, the functional circuit may comprise one or more sensing amplifiers (e.g., sa[1] to sa[J] in FIG. 1*a*, FIG. 2 and FIG. 5), the main auxiliary circuit and/or the additional auxiliary circuit may comprise one or more modified memory cells (e.g., h[k,k'] in FIG. 3*a* and FIG. 3*b* and/or *u* [q, q'] in FIG. 4*a* and FIG. 4*b*), and the tuning load may comprise one or more additional memory cells (e.g., ac[i] in FIG. 6*a* and FIG. 6*b*). Characteristics of each modified memory and each additional memory cell may reflect characteristics of each memory cell, so characteristics of the main conduction path(s), the additional conduction path(s) and the tuning load may reflect (track) the characteristics of each memory cell, and the timing control performed by the control circuit to the functional circuit may dynamically reflect the characteristics of each memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit module with improved timing control, comprising:

a functional circuit;

a control circuit coupled between the functional circuit and a first node;

a main auxiliary circuit coupled to the first node; and an additional auxiliary circuit coupled to the first node and a mode signal; wherein:

the control circuit controls an operation timing of the functional circuit according to response characteristics of the first node;

when the main auxiliary circuit is enabled, the main auxiliary circuit provides one or more main conduction paths between the first node and a base node;

when the additional auxiliary circuit is enabled, the additional auxiliary circuit provides one or more additional conduction paths between the first node and the base node; when the additional auxiliary circuit is disabled, the additional auxiliary circuit does not provide the one or more additional conduction paths; and when the control circuit controls the operation timing of the functional circuit according to the response characteristics of the first node, the main auxiliary circuit is enabled, and the additional auxiliary circuit is disabled or enabled according to whether the mode signal is of a first mode level or a second mode level.

2. The circuit module of claim 1 further comprising:

one or more word lines;

one or more bit lines;

one or more memory cells, with each of the one or more memory cells coupled to one of the one or more word lines and one of the one or more bit lines;

a tracking word line;

a tracking bit line; and one or more tracking memory cells, with each of the one or more tracking memory cells coupled to the tracking bit line and one of the one or more word lines; wherein:

the first node is further coupled to the tracking bit line; and the functional circuit comprises one or more sensing amplifiers, and each of the one or more sensing amplifiers senses a voltage of one of the one or more bit lines according to the operation timing.

3. The circuit module of claim 2, wherein the control circuit controls the operation timing of the functional circuit according to the response characteristics of the first node when the tracking word line is driven.

4. The circuit module of claim 2, wherein:

the main auxiliary circuit comprises one or more first modified memory cells;

each of the one or more first modified memory cells comprises a storage transistor and a pass-gate transistor;

the storage transistor comprises a storage controlled terminal and two storage channel terminals;

the pass-gate transistor comprises a pass-gate controlled terminal and two pass-gate channel terminals;

the two pass-gate channel terminals and the two storage channel terminals are serially coupled between the first node and the base node; and one of the pass-gate controlled terminal and the storage controlled terminal is coupled to the tracking word line, and the other one of the pass-gate controlled terminal and the storage controlled terminal is coupled to a supply voltage.

5. The circuit module of claim 2, wherein:

the additional auxiliary circuit comprises a front-stage transistor and a back-stage transistor;

the front-stage transistor comprises a front-stage controlled terminal and two front-stage channel terminals;

the back-stage transistor comprises a back-stage controlled terminal and two back-stage channel terminals;

the two front-stage channel terminals and the two back-stage channel terminals are serially coupled between the first node and the base node; and one of the front-stage controlled terminal and the back-stage controlled terminal is coupled to the mode signal, and the other one of the front-stage controlled terminal and the back-stage controlled terminal is coupled to the tracking word line.

6. The circuit module of claim 5, wherein the additional auxiliary circuit further comprises an inverter, and the one of the front-stage controlled terminal and the back-stage controlled terminal is coupled to the mode signal via the inverter.

7. The circuit module of claim 2, wherein:

the additional auxiliary circuit comprises one or more second modified memory cells;

each of the one or more second modified memory cells comprises a pass-gate transistor and a storage transistor;

the storage transistor comprises a storage controlled terminal and two storage channel terminals;

the pass-gate transistor comprises a pass-gate controlled terminal and two pass-gate channel terminals;

the two pass-gate channel terminals and the two storage channel terminals are serially coupled between the first node and the base node; and one of the pass-gate controlled terminal and the storage controlled terminal is coupled to the mode signal, and the other one of the pass-gate controlled terminal and the storage controlled terminal is coupled to the tracking word line.

8. The circuit module of claim 7, wherein the additional auxiliary circuit further comprises an inverter, and the one of the pass-gate controlled terminal and the storage controlled terminal is coupled to the mode signal via the inverter.

9. The circuit module of claim 1 further comprising:

a tuning load; and a tuning switch circuit coupled between the tuning load and the first node, controlling whether to electrically connect the tuning load to the first node according to a tuning control signal.

10. The circuit module of claim 9, wherein the tuning load comprises:

an additional bit line; and one or more additional memory cells, with each of the one or more additional memory cells coupled to the additional bit line; wherein:

the tuning switch circuit is coupled to the tuning load at the additional bit line.

11. The circuit module of claim 9, wherein the tuning switch circuit comprises a main switch; the main switch is coupled between the first node and the tuning load, and comprises a main switch control terminal; when a logic value of the main switch control terminal is a first logic value, the main switch electrically connects the tuning load to the first node; when the logic value of the main switch control terminal is a second logic value, the main switch does not electrically connect the tuning load to the first node.

12. The circuit module of claim 11, wherein the tuning switch circuit further comprises an additional switch coupled among the main switch control terminal, the tuning load and a supply voltage; when the logic value of the main switch control terminal is the second logic value, the additional switch electrically connects the tuning load to the supply voltage; when the logic value of the main switch control terminal is the first logic value, the additional switch does not electrically connect the tuning load to the supply voltage.

13. The circuit module of claim 11, wherein the tuning switch circuit further comprises a tuning logic circuit; the tuning logic circuit comprises a first logic input terminal, a second logic input terminal and a logic output terminal respectively coupled to the first node, the tuning control signal and the main switch control terminal.

14. The circuit module of claim 13, wherein:

the tuning logic circuit determines whether a logic value of the first logic input terminal is the first logic value or the second logic value according to whether a voltage at the first logic input terminal is higher than a tuning logic trip point level, and determines a logic value of the logic output terminal according to the logic value of the first logic input terminal and a logic value of the second logic input terminal;

the control circuit determines whether a logic value of the first node is the first logic value or the second logic value according to whether a voltage at the first node is higher than a control logic trip point level; and the tuning logic trip point level and the control logic trip point value are different.

15. The circuit module of claim 14, wherein the tuning logic trip point level is higher than the control logic trip point level.

16. The circuit module of claim 13, wherein the tuning logic circuit further comprises a two-input NAND gate and an inverter.

17. The circuit module of claim 9, wherein:

the response characteristics of the first node relate to an interval during which a voltage at the first node changes from an initial level to a reference level;

there is a middle level between the initial level and the reference level;

when the tuning switch circuit controls whether to electrically connect the tuning load to the first node according to the tuning control signal, the tuning switch circuit controls whether to electrically connect the tuning load to the first node according to whether the tuning control signal is a first logic value when the voltage at the first node changes from the initial level to the middle level; and when the voltage at the first node changes from the middle level to the reference level, the tuning switch circuit does not electrically connect the tuning load to the first node regardless of whether the tuning control signal is the first logic value.

18. The circuit module of claim 9, wherein:

the response characteristics of the first node relate to an interval during which a voltage at the first node changes from an initial level to a reference level;

when the tuning switch circuit controls whether to electrically connect the tuning load to the first node according to the tuning control signal, the tuning switch circuit controls whether to electrically connect the tuning load to the first node according to whether the tuning control signal is a first logic value during a first portion of the interval; and during a second portion of the interval, the tuning switch circuit does not electrically connect the tuning load to the first node regardless of whether the tuning control signal is the first logic value.

19. The circuit module of claim 1, wherein:

the circuit module is supplied by a supply voltage;

when a value of the supply voltage is a first voltage value, the mode signal is of the first mode level;

when the value of the supply voltage is a second voltage value, the mode signal is of the second mode level; and the first voltage value and the second voltage value are different.

20. The circuit module of claim 1, wherein:

the circuit module is triggered by a clock;

when a period of the clock is a first period value, the mode signal is of the first mode level;

when the period of the clock is a second period value, the mode signal is of the second mode level; and the first period value and the second period value are different.

* * * * *